(12) United States Patent
Hosoya et al.

(10) Patent No.: US 8,404,525 B2
(45) Date of Patent: Mar. 26, 2013

(54) SEMICONDUCTOR DEVICE, MANUFACTURING METHOD OF SEMICONDUCTOR DEVICE, AND RFID TAG

(75) Inventors: Kunio Hosoya, Kanagawa (JP); Saishi Fujikawa, Kanagawa (JP); Satohiro Okamoto, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/115,432

(22) Filed: May 25, 2011

(65) Prior Publication Data

US 2011/0230015 A1    Sep. 22, 2011

Related U.S. Application Data

(62) Division of application No. 11/650,731, filed on Jan. 8, 2007, now abandoned.

(30) Foreign Application Priority Data

Jan. 10, 2006  (JP) ................................ 2006-002130

(51) Int. Cl.
*H01L 21/00* (2006.01)

(52) U.S. Cl. ........ 438/125; 438/106; 438/121; 257/678; 257/684; 257/E21.009; 257/E21.064; 257/E21.502; 257/E21.505; 156/73.6; 235/491; 340/572.7; 343/772

(58) Field of Classification Search .............. 438/22, 438/24, 107, 216, 106, 121, 125; 156/73.6; 235/491; 257/678, 684, E21.009, E21.064, 257/E21.502, E21.505; 340/572.7; 343/772
See application file for complete search history.

(56) References Cited

U.S. PATENT DOCUMENTS

| | | | |
|---|---|---|---|
| 5,402,093 A * | 3/1995 | Gibas et al. ................. 335/261 |
| 5,545,291 A | 8/1996 | Smith et al. |
| 5,643,804 A | 7/1997 | Arai et al. |
| 5,783,856 A | 7/1998 | Smith et al. |
| 5,824,186 A | 10/1998 | Smith et al. |
| 5,904,545 A | 5/1999 | Smith et al. |
| 6,417,025 B1 | 7/2002 | Gengel |
| 6,420,266 B1 | 7/2002 | Smith et al. |
| 6,468,638 B2 | 10/2002 | Jacobsen et al. |
| 6,479,395 B1 | 11/2002 | Smith et al. |
| 6,527,964 B1 | 3/2003 | Smith et al. |
| 6,606,247 B2 | 8/2003 | Credelle et al. |
| 6,611,237 B2 * | 8/2003 | Smith ......................... 343/772 |
| 6,623,579 B1 * | 9/2003 | Smith et al. ................. 156/73.6 |
| 6,657,289 B1 | 12/2003 | Craig et al. |
| 6,665,044 B1 | 12/2003 | Jacobsen et al. |
| 6,680,206 B1 * | 1/2004 | McDevitt et al. ............ 436/172 |

(Continued)

FOREIGN PATENT DOCUMENTS

| CN | 1391287 A | 1/2003 |
|---|---|---|
| CN | 1691850 A | 11/2005 |

(Continued)

*Primary Examiner* — Thao Le
*Assistant Examiner* — Eric Jones
(74) *Attorney, Agent, or Firm* — Husch Blackwell LLP

(57) ABSTRACT

The present invention provides a semiconductor device which is formed at low cost and has a great versatility, a manufacturing method thereof, and further a semiconductor device with an improved yield, and a manufacturing method thereof. A structure, which has a base including a plurality of depressions having different shapes or sizes, and a plurality of IC chips which are disposed in the depressions and which fit the depressions, is formed. A semiconductor device which selectively includes a function in accordance with an application, by using the base including the plurality of depressions and the IC chips which fit the depressions, can be manufactured at low cost.

14 Claims, 17 Drawing Sheets

U.S. PATENT DOCUMENTS

| | | |
|---|---|---|
| 6,780,696 B1 | 8/2004 | Schatz |
| 6,836,025 B2 | 12/2004 | Fujisawa et al. |
| 6,864,570 B2 | 3/2005 | Smith |
| 7,080,444 B1 | 7/2006 | Craig et al. |
| 7,229,848 B2 | 6/2007 | Smith |
| 7,244,326 B2 | 7/2007 | Craig et al. |
| 7,253,735 B2 * | 8/2007 | Gengel et al. ............ 340/572.7 |
| 7,332,798 B2 | 2/2008 | Akita et al. |
| 7,353,598 B2 | 4/2008 | Craig et al. |
| 7,453,199 B2 | 11/2008 | Sakai |
| 7,727,804 B2 | 6/2010 | Smith |
| 7,767,627 B1 * | 8/2010 | Goldwasser et al. ........... 506/22 |
| 2002/0186341 A1 | 12/2002 | Yamamura et al. |
| 2003/0186228 A1 * | 10/2003 | McDevitt et al. ................. 435/6 |
| 2004/0188531 A1 * | 9/2004 | Gengel et al. ................ 235/491 |
| 2005/0164485 A1 * | 7/2005 | Onozawa ...................... 438/616 |
| 2005/0250229 A1 * | 11/2005 | Nuggehalli et al. ............ 438/24 |
| 2007/0031992 A1 | 2/2007 | Schatz |

FOREIGN PATENT DOCUMENTS

| | | |
|---|---|---|
| EP | 0 747 948 A2 | 12/1996 |
| EP | 1 367 645 A2 | 12/2003 |
| EP | 1 372 194 A1 | 12/2003 |
| EP | 1 463 116 A2 | 9/2004 |
| EP | 1 684 338 A1 | 7/2006 |
| JP | 6-334113 | 12/1994 |
| JP | 7-86502 | 3/1995 |
| JP | 9-506742 | 6/1997 |
| JP | 9-260581 | 10/1997 |
| JP | 2002-100726 | 4/2002 |
| JP | 2003-223626 | 8/2003 |
| JP | 2004-56093 | 2/2004 |
| JP | 2005-19817 | 1/2005 |
| JP | 2005-268705 | 9/2005 |
| WO | WO 95/17005 A1 | 6/1995 |
| WO | WO 96/41372 A1 | 12/1996 |
| WO | WO 2004/086289 A2 | 10/2004 |
| WO | WO 2005/045919 A1 | 5/2005 |

* cited by examiner

1600

1600

1600

1600

1600

1600

US 8,404,525 B2

SEMICONDUCTOR DEVICE, MANUFACTURING METHOD OF SEMICONDUCTOR DEVICE, AND RFID TAG

This application is a divisional of U.S. application Ser. No. 11/650,731, filed on Jan. 8, 2007 now abandoned.

BACKGROUND OF THE INVENTION

1. Field of the Invention

The present invention relates to a semiconductor device, a manufacturing method of a semiconductor device, and an RFID tag.

2. Description of the Related Art

In recent years, wireless chips which transmit and receive data wirelessly have been developed actively. The wireless chips which transmit and receive data are called an RFID (Radio Frequency Identification) tag, an RF tag, an RF chip, a wireless tag, a wireless processor, a wireless memory, an IC (Integrated Circuit) tag, an IC label, an electronic tag, an electronic chip, or the like. Wireless chips for practical use now are wireless chips using a silicon substrate, which are the mainstream.

The production cost is a problem when a wireless chip (hereinafter referred to as an RFID tag in this specification) which transmits and receives data wirelessly is put to practical use. The production cost is divided into two types. One is a cost of materials and the other is a processing cost.

The cost of materials can be solved by miniaturization of a production rule, adoption of low cost materials, or the like. On the other hand, a problem of the processing cost cannot be solved as easily as the cost of materials. This is because a flip chip mounting method is often used when an inlet (one in which an IC chip is connected to an antenna and sealed) for an RFID tag is formed. Here, a flip chip mounting method means a method in which each IC chip is picked up and mounted on a film substrate. In this specification, an IC chip is a package in which an integrated circuit is formed on a silicon substrate, over a glass substrate, or the like. In the case of using a flip chip mounting method, there is a problem in that a yield is reduced but a processing cost is increased when an IC is disposed due to the miniaturization of a production rule, that is, the miniaturization of an IC chip.

As one of methods for reducing the processing cost, FSA (Fluidic Self Assembly) techniques shown in Reference 1 (U.S. Pat. No. 6,417,025B1) and Reference 2 (PCT International Publication No. WO 2004/086289A2) are proposed. The FSA techniques are techniques in which a base having a depression and an IC chip which fit the shape and the size of the depression are used, and the IC chip is disposed on the base in a self-aligned manner in liquid to form an inlet.

Since one RFID tag has been formed using one IC chip including the aforementioned FSA techniques so far, there has been a problem in that versatility of an IC chip has been low. For example, in the case where a memory having a large capacity larger than a memory required for another application has been required in an application, a new IC chip has been formed only for changing a memory capacity even in the case where there had already been an IC chip satisfying another condition. That is, since the IC chip has been formed based on a dedicated design for each RFID tag, a new IC chip has been required to be designed in accordance with its function when an RFID tag having another function has been required. Therefore, the limited production of diversified products has been extremely difficult in terms of cost. In addition, it has been difficult to provide an RFID tag having a required function immediately because of the dedicated design.

When a defect has been generated by a wiring defect or the like, there has been no method capable of restoring an RFID tag easily. Therefore, when a defect has been generated in an RFID tag, there has been a problem in that a yield has been decreased because the defective tag has been discarded.

SUMMARY OF THE INVENTION

In view of the aforementioned problems, an object of the present invention is to provide a semiconductor device which is formed at low cost and has a great versatility, a manufacturing method thereof, and further a semiconductor device with an improved yield, and a manufacturing method thereof.

One feature of structures of the present invention is that a semiconductor device includes a base including a plurality of depressions having different shapes or sizes, and a plurality of IC chips which are disposed in the depressions and which fit the depressions. One feature of structures of the present invention is that One feature of structures of the present invention is that a semiconductor device includes a base including a plurality of depressions having different shapes or sizes, a plurality of IC chips which are disposed in the depressions and which fit the depressions, a film covering the base and the IC chips, and a wiring formed over the film and electrically connected to the IC chip.

In the above-described structure, one feature of the semiconductor device is that the wiring is formed by a droplet discharging method or a screen printing method, the base is formed of a resin, a part of the plurality of depressions has a protruding portion, and an antenna is included.

In the above-described structure, one feature of the semiconductor device is that the IC chip is formed using a silicon substrate, a gallium arsenide substrate, a silicon germanium substrate, an SOI substrate, a quartz substrate, or a glass substrate.

An RFID tag can be manufactured using the above-described semiconductor device.

One feature of structures of the present invention is that a semiconductor device includes a base including a first depression and a second depression which have different shapes or different sizes, a first IC chip which is disposed in the first depression and which fits the first depression, and a second IC chip which is disposed in the second depression and which fits the second depression. The shapes or the sizes of the first IC chip and the second IC chip are different from each other.

One feature of structures of the present invention is that a semiconductor device includes a base including a first depression and a second depression which have different shapes or different sizes, a first IC chip which is disposed in the first depression and which fits the first depression, a second IC chip which is disposed in the second depression and which fits the second depression, a film covering the base, the first IC chip, and the second IC chip, and a wiring formed over the film, and electrically connected to the first IC chip or the second IC chip. The shapes or the sizes of the first IC chip and the second IC chip are different from each other.

In the above-described structure, one feature of the semiconductor device is that the wiring is formed by a droplet discharging method or a screen printing method, the base is formed of a resin, and an antenna is included.

In the above-described structure, one feature of the semiconductor device is that the base includes a third depression, and the third depression includes a protruding portion in the third depression.

In the above-described structure, one feature of a semiconductor device is that the IC chip is formed using a silicon substrate, a gallium arsenide substrate, a silicon germanium substrate, an SOI substrate, a quartz substrate, or a glass substrate.

An RFID tag can be manufactured using the above-described semiconductor device.

One feature of structures of the present invention is that a semiconductor device is that a plurality of depressions which have different shapes or different sizes in a base are formed, and IC chips which fit the plurality of depressions in liquid are disposed.

One feature of structures of the present invention is that a semiconductor device is that a plurality of depressions which have different shapes or different sizes are formed in a base, IC chips which fit the depressions are disposed in liquid, a film is formed so as to cover the base and the IC chips, and a wiring electrically connected to the IC chip is formed over the film.

One feature of structures of the present invention is that a semiconductor device is that a first depression and a second depression which have different shapes or different sizes are formed in a base, a first IC chip which fits the first depression and a second IC chip which fits the second depression are disposed in liquid. The shapes or the sizes of the first IC chip and the second IC chip are different from each other.

In the above-described structure, one feature of the semiconductor device is that the wiring is formed by a droplet discharging method or a screen printing method, and an antenna is included.

One feature of structures of the present invention is that a semiconductor device is that a first depression having a protruding portion and a second depression are formed in a base, and an IC chip which fits the second depression is disposed in the second depression in liquid. Note that the shape and the size of the second depression are equal to the shape and the size of the first depression excluding the protruding portion.

One feature of structures of the present invention is that a semiconductor device is that a first depression having a protruding portion and a second depression are formed in a base, a first IC chip which fits the second depression is disposed in the second depression in liquid, the protruding portion of the first depression is removed, a second IC chip which fits the first depression of which the protruding portion is removed is disposed in the first depression of which the protruding portion is removed. Note that the shape and the size of the second depression are equal to the shape and the size of the first depression excluding the protruding portion, and also the shape and the size of the first IC chip are equal to the shape and the second IC chip.

A semiconductor device which selectively includes a function in accordance with an application can be manufactured by using a base having a plurality of depressions and IC chips which fit depressions by using the present invention. In addition, a semiconductor device can be manufactured by using an existing facility as long as only an IC chip having an additional function may be additionally manufactured in the case where high performance or high efficiency is obtained; therefore, the semiconductor device can be manufactured at lower cost compared to the case where a high-performance IC chip is designed from the beginning.

Further, restoration can be easily performed when a defective is generated because a spare depression is formed separately from a normal depression in which an IC chip is disposed on a base. When a wiring which is electrically connected to an IC chip is formed, restoration can be easily performed by using a droplet discharging method typified by an ink-jet method.

DETAILED DESCRIPTION OF THE INVENTION

Embodiment Modes

Figure 1A:
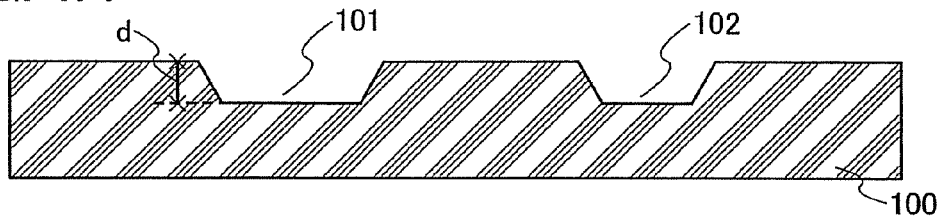
FIGS. 1A to 1E are diagrams showing a manufacturing process of a semiconductor device of the present invention.

Embodiment modes of the present invention are hereinafter explained with reference to the drawings. However, the present invention is not limited to the following description. As is easily known to a person skilled in the art, the mode and the detail of the present invention can be variously changed without departing from the spirit and the scope of the present invention. Thus, the present invention is not interpreted as being limited to the following description of the embodiment modes. Note that the same reference numeral is commonly used to denote the same component among different drawings in structures of the present invention explained below.

In addition, the present invention can be applied to a semiconductor device which uses any of frequency mode, for example, a long wave band (135 kHz or the like), a short wave band (6.78 MHz, 13.56 MHz, 27.125 MHz, 40.68 MHz, or the like), an ultra-short wave band (433.92 MHz, 869.0 MHz, 915.0 MHz, or the like), a microwave band (2.45 GHz, 5.8 GHz, 24.125 GHz, or the like), or the like without being limited to a specific frequency mode to be used. In the present invention, a semiconductor device which transmits and receives data wirelessly is referred to as an RFID tag. In this specification, an IC chip is referred to as an integrated circuit formed on a silicon substrate, or an integrated circuit formed over a glass substrate or the like.

(Embodiment Mode 1)

This embodiment mode describes a manufacturing method of a semiconductor device using a plurality of IC chips, particularly a manufacturing method of an RFID tag with reference to FIGS. 1A to 3C below.

First, a depression 101 and a depression 102 each having an arbitrary shape are formed in a base 100 (see FIG. 1A). As a material of the base 100, a synthetic resin having flexibility such as plastic which is typified by polyethylene terephthalate (PET), polyethylene naphthalate (PEN), or polyethersulfone (PES), or acrylic can be used. The depression 101 and the depression 102 can be formed using an embossing machine, a punching machine, or the like. The depression 101 and the depression 102 can also be formed using a laser ablation, an FIB (Focused Ion Beam), or the like.

At this time, the depression 101 and the depression 102 are preferably formed to have different shapes and sizes. This is because IC chips are selectively disposed in accordance with functions when the IC chips are disposed later. It is needless to say that the depressions are not limited to having different shapes and sizes, and the depressions which have only different shapes or only different sizes may be formed as long as they can be selectively disposed. Here, the shape mainly means a shape of an opening or a bottom surface of the depression, and the size mainly means a size (area or the like) of the opening or the bottom surface of the depression; however, the present invention is not limited to the shape of the opening or the bottom surface and the size of the opening or the bottom surface. That is, as long as depressions can be selectively disposed, depressions may be formed so as to have different shapes or sizes in other parts (e.g., a shape or a size of a side surface) than in a top surface or a bottom surface. In this embodiment mode, only two depressions 101 and 102 are shown; however, the number of depressions is not particularly limited, and a required number of depressions may be formed in order to manufacture a semiconductor device having a desired function.

Figure 1B:
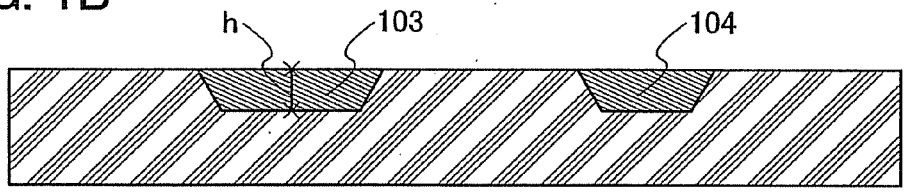

Next, the base 100 in which the depression 101 and the depression 102 are formed is dipped into a suspension (also referred to as a slurry) in which IC chips are dispersed in liquid, and an IC chip 103 and an IC chip 104 are disposed in the depression 101 and the depression 102, respectively (see FIG. 1B). Here, the IC chip 103 and the IC chip 104 have a shape and a size which fit the depression 101 and the depression 102, respectively, which are formed in the base 100. The IC chips and the depressions are formed so that a height "h" of each of the IC chip 103 and the IC chip 104 (see FIG. 1B) and a depth "d" of each of the depression 101 and the depression 102 are almost equal to each other (see FIG. 1A). Note that a size of the IC chip is about 0.5 μm to 5 mm on a side, which can be used.

A manufacturing method of the IC chip 103 and the IC chip 104 is not particularly limited. As a material, a silicon (Si) substrate, a silicon germanium (SiGe) substrate, a gallium arsenic (GaAs) substrate, or the like is preferably used. An SOI (Silicon On Insulator) substrate, a quartz substrate, or a glass substrate can also be used. A semiconductor device using a glass substrate is described in detail in Embodiment Mode 5. As liquid which is used for the suspension, a material is not particularly limited. As long as a material does not deteriorate IC chips, the material can be used; for example, water, alcohol, fats and oils, or the like can be used. When selecting liquid, specific gravity, viscosity, or the like may be considered, which is more preferable.

In addition, in the case where shapes and sizes of depressions are exclusive to each other, the suspension in which plural kinds of IC chips are dispersed can be used. In this case, a step of dipping the base into the suspension may be performed once.

On the other hand, in the case where shapes and sizes of depressions are not exclusive to each other, plural kinds of IC chips cannot be disposed at the same time. This is because a small IC chip may be disposed in a depression for a large IC chip. In such a case, a step of dipping the base into a suspension may be appropriately selected such that the base is dipped into a suspension in which large IC chips are dispersed, and then dipped into a suspension in which small IC chips are dispersed. In terms of suppressing the increase of the number of steps, the shapes and the sizes of the depressions are preferably exclusive to each other.

Disposition of an IC chip is performed by gravity applied to the IC chip; however, some kind of external force may be applied for promoting disposition. For example, vibration such as an ultrasonic wave may be applied to the suspension or the base. The suspension is removed at a stage where IC chips are disposed in almost all of depressions by the above-described steps. Here, the phrase "almost all of depressions" refers to about 70 to 100% of the entire depressions for example; however, the phrase "almost all of depressions" is not limited to this because the depressions can be arbitrarily set based on a required throughput, or the like. Note that depressions in which IC chips are not disposed are detected using appropriate detecting means (e.g., a CCD camera) or the like, and IC chips are mechanically disposed using a flip chip mounting method or the like. The removed suspension is collected and recycled.

Figure 17A:
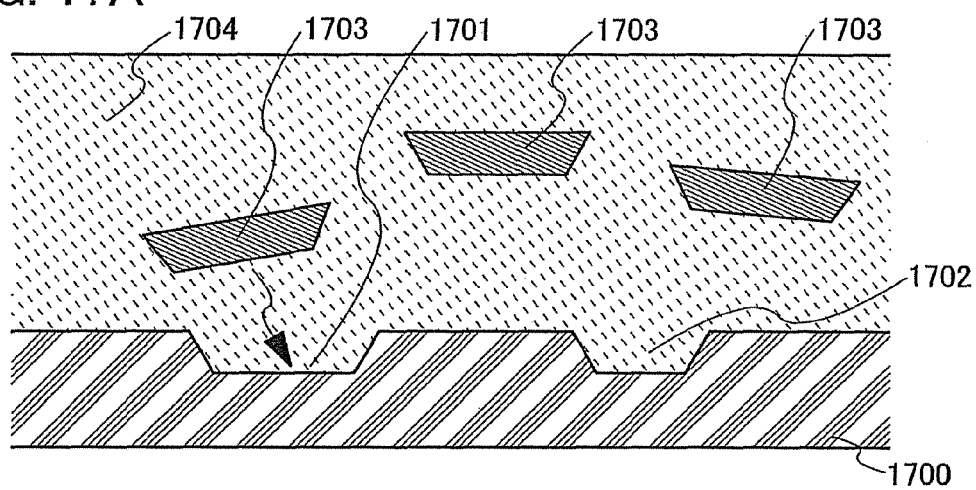
FIGS. 17A and 17B are diagrams showing a manufacturing process of a semiconductor device of the present invention.
Figure 17B:
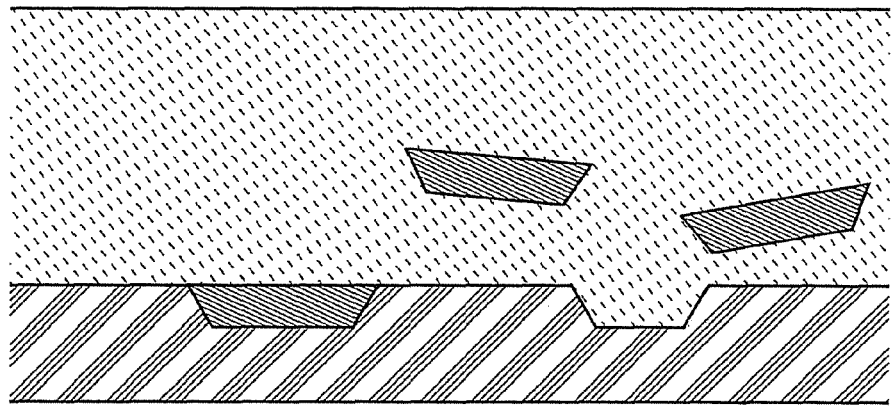

FIGS. 17A and 17B schematically show a state that an IC chip 1703 is disposed in a depression 1701 of a base 1700. The base 1700 having depressions is dipped into a suspension 1704 in which the IC chips 1703 are dispersed in liquid (see FIG. 17A), and the IC chip 1703 is disposed in the depression 1701 by gravity (see FIG. 17B). In FIGS. 17A and 17B, the IC is not disposed in a depression 1702; however, disposition is not limited to this, and different IC chips from the IC chip 1703 may be disposed therein. In addition, some kind of external force may be applied besides gravity.

Note that a memory, a CPU, an RF circuit, a controller circuit, or the like can be included in a function of the IC chip; however, the function is not limited to them. In addition, one kind or plural kinds of functions may be included in one IC chip.

Next, a protective film 105 is provided so as to cover the base 100, the IC chip 103, and the IC chip 104. Specifically, a method such as thermo compression bonding is used to attach the protective film. Here, a planarizing film may be formed instead of the protective film 105. The planarizing film can be formed using a material such as photopolymer (photo resist) by a method such as a spin coat method.

Figure 1C:
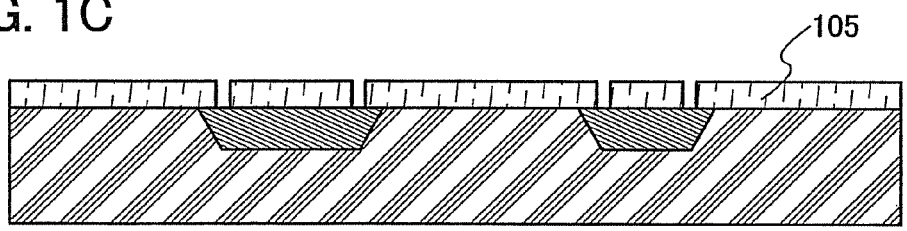

Next, the protective film 105 is irradiated with a laser beam or an FIB (Focused Ion Beam) or by a mechanical punching process or the like, thereby forming an opening (see FIG. 1C). This opening is formed on a portion corresponding to an electrode of the IC chip. When a planarizing film is formed instead of the protective film 105, a mask is formed so as to remove the portion corresponding to the electrode of the IC chip, and etching is performed.

Figure 1D:
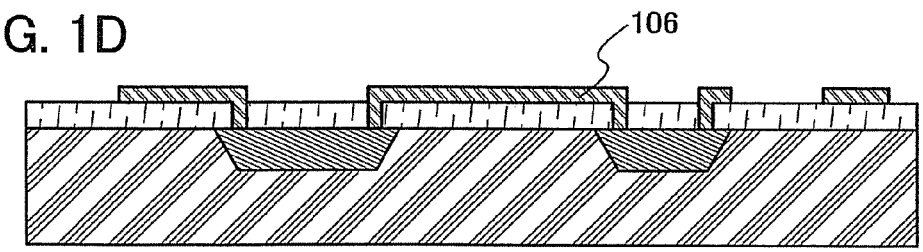

The opening is formed in the protective film 105, and then a wiring 106 is formed so as to be electrically connected to the electrode of the IC chip (see FIG. 1D). Note that in order to have a good connection between the electrode of the IC chip and the wiring 106, a connecting portion using a material such as gold (Au) may be formed in the opening. Silver (Ag) is preferable as a material of the wiring. However, the material is not limited to this, and a conductive element such as gold (Au), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), or tantalum (Ta), or an alloy or compound material containing such an element as its main component, or the like can be used. As a forming method, an evaporation method, a sputtering method, a CVD method, a printing method, a droplet discharging method, or the like can be used. A manufacturing method of a semiconductor device when a wiring is formed using a droplet discharging method is described in details in Embodiment Mode 2.

Figure 1E:
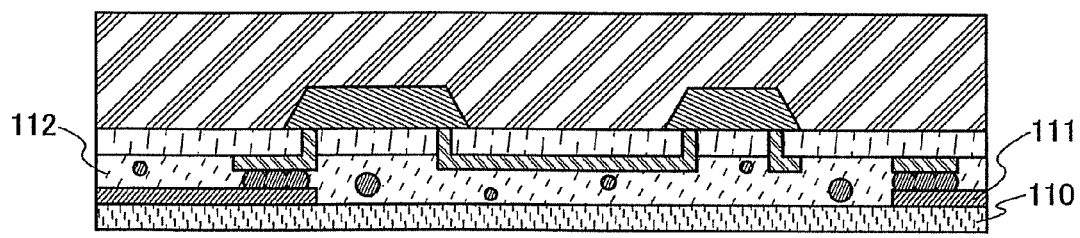

Next, a base 110 provided with a conductive layer 111 functioning as an antenna is pressure-bonded to the base 100 using an anisotropic conductive material 112 (see FIG. 1E). As the anisotropic conductive material 112, an anisotropic conductive paste (ACP) which is heat cured or an anisotropic conductive film (ACF) which is heat cured can be used. The anisotropic conductive paste is referred to as a binder layer, and has a structure in which particles (hereinafter referred to as conductive particles) including conductive surfaces are dispersed in a layer containing an adhesive agent as its main component. The anisotropic conductive film has a structure in which conductive particles are dispersed in a thermoset resin film or a thermoplastic resin film. Note that a spherical resin on which nickel (Ni), gold (Au) or the like is plated is used as the conductive particles. In order to prevent electrical short-circuit between the conductive particles at a portion in which an electrically connection is not required, an insulating property containing silica or the like may be mixed. In this embodiment mode, an anisotropic conductive paste is used as the anisotropic conductive material 112.

The conductive layer 111 over the base 110 can be formed by a plasma CVD method, a sputtering method, a printing method, a droplet discharging method, or the like. Preferably, an element selected from aluminum (Al), titanium (Ti), silver (Ag), or copper (Cu), or an alloy or compound material containing such an element as its main component, is used to form the conductive layer 111 in a single layer or a laminated layer. Specifically, the conductive layer 111 is formed using a paste containing silver by a screen printing method, and then heat treatment is performed at a temperature of 50 to 350° C. Alternatively, an aluminum layer is formed by a sputtering method and the aluminum layer is patterned to form the conductive layer 111. The patterning of the aluminum layer is preferably performed by a wet etching process, and heat treatment is preferably performed at a temperature of 150 to 300° C. after the wet etching process.

In accordance with the above-described steps, a semiconductor device provided with a plurality of IC chips can be formed.

Next, a semiconductor device which is obtained in accordance with the steps of this embodiment mode is described with reference to FIGS. 2A to 2C.

Figure 2A:
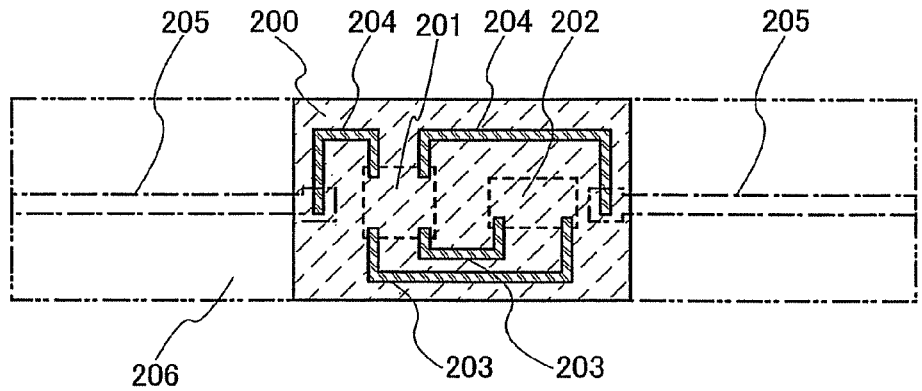
FIGS. 2A to 2C are diagrams showing a semiconductor device of the present invention.

FIG. 2A shows a semiconductor device in which an IC chip 201 and an IC chip 202 are disposed on a base 200. The IC chip 201 and the IC chip 202 are electrically connected to each other through a wiring 203. A linear shaped antenna 205 is connected to the IC chip 201 through a wiring 204. Note that in FIG. 2A, the IC chip 201 and the IC chip 202 are shown by dashed lines, the antenna 205 is shown by alternate long and short dash lines, and a base 206 having the antenna 205 is shown by alternate long and two short dashes lines.

Figure 2B:
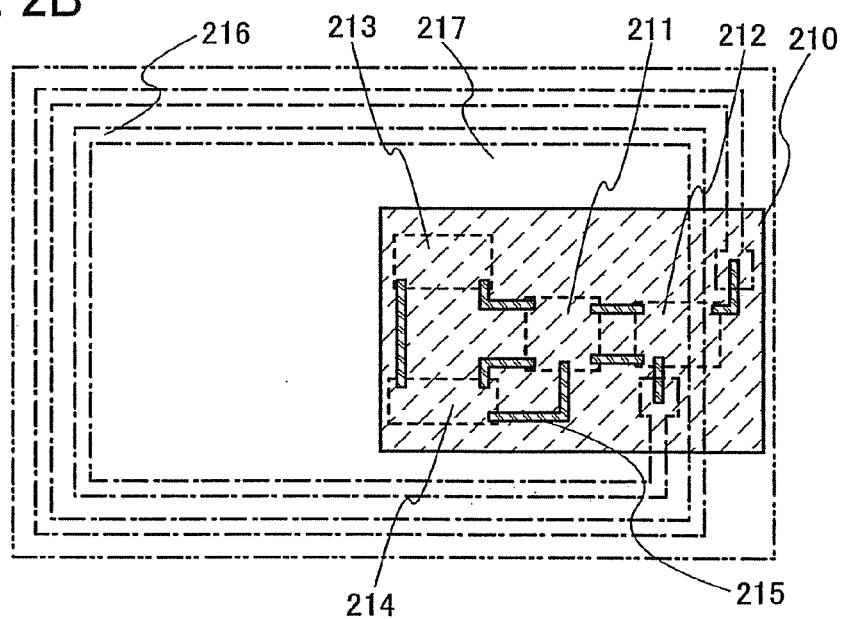
Figure 2C:
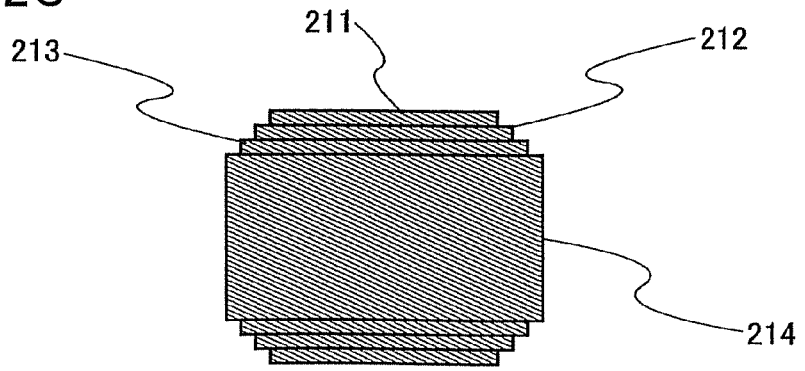

FIG. 2B shows a semiconductor device having a structure in which four IC chips of an IC chip 211, an IC chip 212, an IC chip 213, and an IC chip 214 are disposed on a base 210. The IC chips are electrically connected to each other through a wiring 215. A spiral antenna 216 is connected to the IC chip 212 through the wiring 215. Note that in FIG. 2B, the IC chip 211, the IC chip 212, the IC chip 213, and the IC chip 214 are shown by dashed lines, the antenna 216 is shown by alternate long and short dash lines, and a base 217 having the antenna 216 is shown by alternate long and two short dashes lines. Here, FIG. 2C shows a relation of the sizes of four IC chips included in the semiconductor device of FIG. 2B. As shown in FIG. 2C, since the IC chips having different sizes in vertical direction and horizontal direction are used, these four IC chips can be disposed at the same time by the above-mentioned method.

Figure 3A:
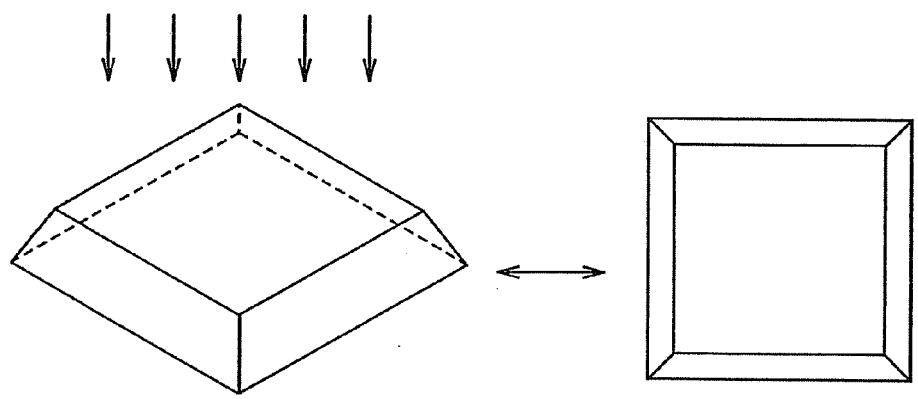
FIGS. 3A to 3C are views showing shapes of semiconductor devices of the present invention.
Figure 3B:
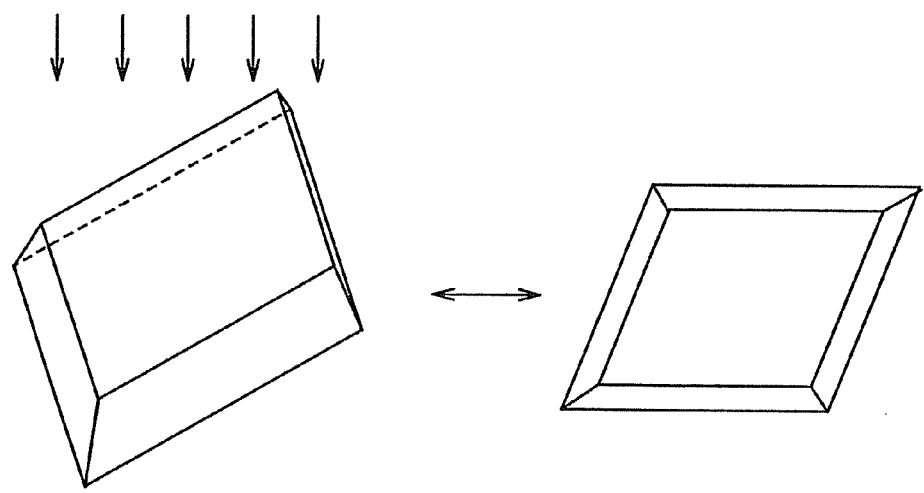
Figure 3C:
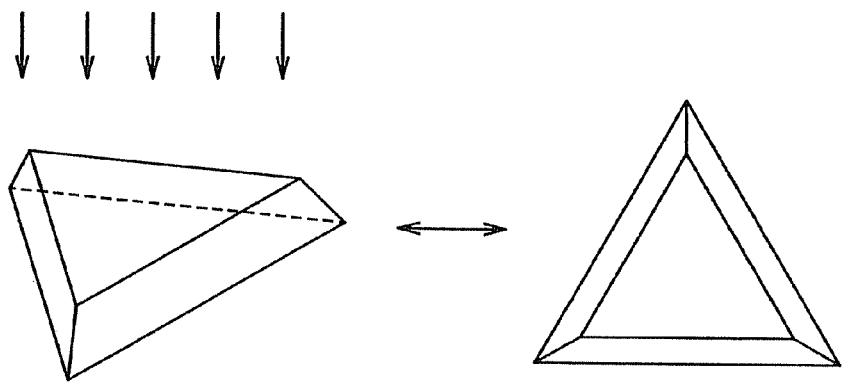

FIGS. 3A to 3C are examples of shapes of IC chips which can be used in this embodiment mode. A left view of FIG. 3A is a perspective view of an IC chip, and a right view of FIG. 3A is a top view of the left view of FIG. 3A, which is seen from the direction indicated by arrows. The IC chip shown in FIG. 3A has a square shape in the top view; however, the shape is not limited to this, and the IC chip may have a rectangular shape. Using the shape as shown in FIG. 3A can increase the number of IC chips formed from one wafer. The square shape as shown in FIG. 3A is suitable for an IC chip since it is less subject to the influence of a plane direction of semiconductor crystal. Note that as shown in FIG. 3A, an area of a top surface is made larger than that of a lower surface; therefore, up and down directions can be controlled at the time of disposition. Specifically, an IC chip can be disposed with a surface having an electrode facing up. Note that in this embodiment mode, the top surface in FIG. 3A is disposed such that it faces the bottom surface side of the depression.

Similarly to FIG. 3A, in each of FIGS. 3B and 3C, a left view is a perspective view of an IC chip, and a right view is a top view which is seen from the direction indicated by arrows. The shape shown in FIG. 3B has a parallelogram shape in the top view. Note that in FIG. 3B, the top view may have a rhombic shape, a trapezoidal shape, or an arbitrary quadrangular shape. Even when such a shape is used, the number of IC chips formed from one wafer can be increased. Since the shape of FIG. 3B can be combined with the shape shown in FIG. 3A, or the like, and disposed in a suppression of the base, IC chips can be disposed without increasing the number of steps. The shape of FIG. 3C has an equilateral triangle in the top view; however, an shape of an arbitrary triangle such as an isosceles triangle or a right triangle may be used, and the present invention is not limited to the equilateral triangle. In addition, a shape such as a polygon or a circle may be used, and the present invention is not limited to the triangle shape. In that case, a shape to be used is preferably determined in consideration of the number of IC chips and the plane direction of crystal.

As described in this embodiment mode, a plurality of IC chips depending on each function are used, and an IC chip having a desired function is not required to be redesigned. Therefore, a semiconductor device of which cost is reduced can be manufactured. Since a combination of the IC chips can be easily modified, a semiconductor device having a required function can be provided immediately. For example, although a 32-bit memory is mounted as an early specification, in the case where a 128-bit memory as well as modification of application are required, only the memory can be modified, and a semiconductor device can be provided immediately and at low cost.

(Embodiment Mode 2)

In this embodiment mode, a manufacturing method of a semiconductor device using a plurality of IC chips, particularly a manufacturing method of an RFID tag is described below with reference to FIGS. 4A to 6B when restoration can be performed by a droplet discharging method when forming a wiring. Note that steps up to and including the state shown in FIG. 1B of Embodiment Mode 1 can be similarly used in this embodiment mode; therefore, detail description is omitted.

The state shown in FIG. 1B of Embodiment Mode 1 is obtained, and then, a protective film 405 having an insulating property is provided so as to cover a base 400, an IC chip 403, and an IC chip 404. Note that the base 400, the IC chip 403, the IC chip 404, and the protective film 405 correspond to the base 100, the IC chip 103, the IC chip 104, and the protective film 105 in FIG. 1, respectively. Here, a planarizing film having an insulating property may be formed instead of the protective film 405. The planarizing film may be formed over the protective film or the protective film may be formed over the planarizing film. In this embodiment mode, a structure using one layer of the protective film 405 is shown; however, it is not limited to this structure, and plural layers of a protective film and a planarizing film may be provided. The planarizing film can be formed using a material such as photopolymer (photo resist) by a method such as a spin coat method.

Figure 4A:
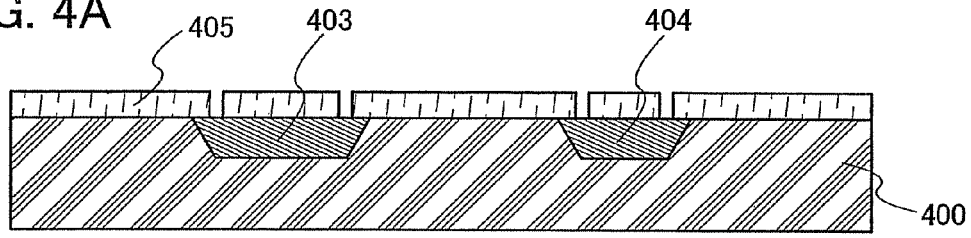
FIGS. 4A to 4E are diagrams showing a manufacturing process of a semiconductor device of the present invention.

Next, the protective film 405 is irradiated with a laser beam or an FIB or by a mechanical punching process or the like, thereby forming an opening (see FIG. 4A). This opening is formed in a portion corresponding to an electrode of the IC chip. When a planarizing film is formed instead of the protective film 405, a mask is formed so as to remove the portion corresponding to the electrode of the IC chip, and etching is performed.

Figure 4B:
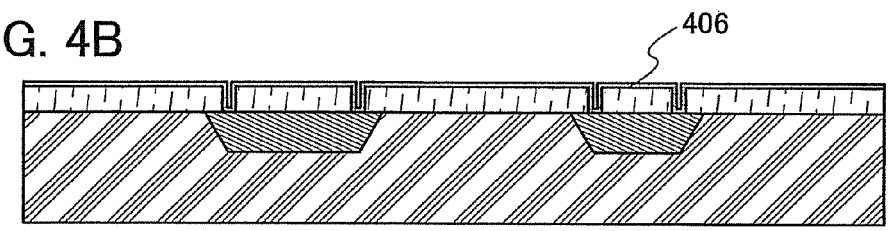

The opening is formed in the protective film 405, and then a film 406 having low wettability is formed (see FIG. 4B). Note that a property to be wet with liquid (referred to as a lyophilic property) or a property to repel liquid (referred to as a liquid repellent property) is collectively referred to as wettability. A film having low wettability, which is a film having a liquid repellent property, is formed, and a lyophilic region and a liquid repellent region are formed in a step shown later. Thus, a wiring with a desired shape can be formed by a droplet discharging method.

Note that as the protective film 405, a material having a porous surface is more preferably used. This is because since the protective film to become a lyophilic region later has the porous surface, a contact area between a composition which is used for a droplet discharging method and a surface of the protective film is increased, and adhesion can be improved.

For the substance having low wettability, that is, a substance having a liquid repellent property, a substance containing a fluorocarbon group (fluorocarbon chain) or a substance containing a silane coupling agent can be used. A monomolecular film can be formed by using the silane coupling agent, and decomposition and modification can be performed efficiently; therefore, wettability can be changed in a short time. In addition, not only a silane coupling agent containing a fluorocarbon group (fluorocarbon chain) but also one containing an alkyl group can be used. Since the silane coupling agent has a different effect of reducing the wettability depending on whether a contained functional group is a fluorocarbon group or an alkyl group, a material of the silane coupling agent can be selected so that necessary wettability can be obtained. Therefore, wettability can be set as appropriate.

The silane coupling agent is denoted by the chemical formula: $R_n$—Si—$X_{(4-n)}$ (n=1, 2, 3). In this chemical formula, R represents a substance containing a relatively inactive group such as an alkyl group. X represents a hydrolytic group such as halogen, a methoxy group, an ethoxy group, or an acetoxy group, which is bondable by a condensation with a hydroxyl group or adsorbed water on a substrate surface.

For the substance having low wettability, alkoxysilane containing an alkyl group for R of the silane coupling agent can be used. For example, as an organic silane, octadecyltrimethoxysilane or the like can be used. As alkoxysilane, alkoxysilane having 2 to 30 carbon atoms is preferably used. Typically, decyltrimethoxysilane, ethyltriethoxysilane, propyltriethoxysilane, octyltriethoxysilane, decyltriethoxysilane, dodecyltriethoxysilane, octadecyltriethoxysilane (ODS), eicosyltriethoxysilane, and triacontyltriethoxysilane can be used. In particular, a silane compound having a long chain alkyl group is preferably used because it can reduce wettability. Further, decyltrichlorosilane, tetradecyltrichlorosilane, octadecyltrichlorosilane, eicosyltrichlorosilane, docosyltrichlorosilane, or the like can be also used.

As another example of the silane coupling agent which can be used to reduce the wettability, a fluorine-based silane coupling agent containing a fluoroalkyl group for R (such as fluoroalkylsilane (FAS)) can be used. R in the FAS has a structure represented by $(CF_3)(CF_2)_x(CH_2)_y$ (x is an integer in the range of 0 to 10, inclusive, and y is an integer in the range of 0 to 4, inclusive). When a plurality of R or X are bonded with Si, the Rs or Xs may be the same or different from one another. Typically, the following can be used as the FAS: fluoroalkylsilane (hereinafter, also referred to as FAS) such as, heptadecafluorotetrahydrodecyltriethoxysilane, heptadecafluorotetrahydrodecyltrichlorosilane, tridecafluorotetrahydrooctyltrichlorosilane, trifluoropropyltrimethoxysilane, or tridecafluorooctyltrimethoxysilane. Further, a coupling agent in which a hydrolytic group of tridecafluorooctyltrichlorosilane or the like is halogen can also be used.

Further, as the substance having low wettability, a titanate coupling agent or an aluminate coupling agent may be used. For example, isopropyltriisooctanoyl titanate, isopropyl(dioctylpyrophosphate) titanate, isopropyltristearoyl titanate, isopropyl tris(dioctylphosphate) titanate, isopropyldimethacrylisostearoyl titanate, acetoalkoxy aluminumdiisopropylate, or the like can be used. Note that the compounds described here are just examples, and it is not limited to these examples.

In the case of forming the above low wettability substance as a film in the formation region, a vapor-phase deposition method or the like can be used for forming the low wettability substance in the formation region by evaporating a liquid substance. Further, the low wettability substance may be formed by a spin coat method, a dip method, a droplet discharging method, and a printing method (a screen printing method, an offset printing method, or the like), or the like, and may be formed such that the low wettability substance may also be dissolved in solvent to be solution.

For solvent of a solution containing the low wettability substance, water, alcohol, ketone, hydrocarbon-based solvent (such as aliphatic hydrocarbon, aromatic hydrocarbon, halogenated hydrocarbon), and ether-based compound; and a mixture thereof can be used. For example, methanol, ethanol, propanol, acetone, butanone, n-pentane, n-hexane, n-heptane, n-octane, n-decane, dicyclopentane, benzene, toluene, xylene, durene, indene, tetrahydronaphthalene, decahydronaphthalene, squalane, carbon tetrachloride, chloroform, methylene chloride, trichloroethane, diethyl ether, dioxane, dimethoxyethane, tetrahydrofran, or the like is used. The concentration of the above solution is not particularly limited; and the concentration may be in a range of 0.001 wt % to 20 wt %.

Further, amine such as pyridine, triethylamine, or dimethylaniline may be mixed in the above low wettability substance. Furthermore, carboxylic acid such as formic acid or acetic acid may be added as a catalyst agent.

Further, as an example of a composition that controls to reduce the wettability, a material having a fluorocarbon group (fluorocarbon chain) can be used (a fluorine-based resin). As the fluorine-based resin, polytetrafluoroethylene (PTFE; a polytetrafluoroethylene resin), perfluoroalkoxyalkane (PFA; a tetrafluoroethylene perfluoroalkylvinylether copolymer resin), perfluoroethylene propene copolymer (PEEP; a tetrafluoroethylene-hexafluoropropylene copolymer resin), ethylene-tetrafluoroethylene copolymer (ETFE; a tetrafluoroethylene-ethylene copolymer resin), polyvinylidene fluoride (PVDF; a polyvinylidene fluoride resin), polychlorotrifluoroethylene (PCTFE; a polytrifluorochloroethylene resin), ethylene-chlorotrifluoroethylene copolymer (ECTFE; a polytrifluorochloroethylene-ethylene copolymer resin), polytetrafluoroethylene-perfluorodioxol copolymer (TFE/PDD), polyvinylfluoride (PVF; a vinyl fluoride resin), or the like can be used.

Further, when a treatment by $CF_4$ plasma or the like to an inorganic or organic material is performed, wettability can be reduced. As the organic material, for instance, a material of a solvent such as $H_2O$ mixed with a water-soluble resin such as polyvinyl alcohol (PVA) can be used. In addition, a combination of PVA and another water-soluble resin can be used.

As described above, the film 406 having low wettability is formed with the use of a spin coat method in which the low wettability substance in the liquid state is attached to the formation region. At this time, a treatment temperature may be set to be a room temperature (approximately, 25° C.) to 150° C., and treatment time may be set to be several minutes to 12 hours. A treatment condition can be set as appropriate depending on a property of the low wettability substance, a concentration of the solution, a treatment temperature, and treatment time. When a thin film to be formed is washed with solvent that can be used in the case of making solution containing the above low wettability substance, an unreacted low wettability substance can be removed. In this case, an ultrasonic washing machine or the like may also be used.

A thin film having a thickness in the range from 0.3 nm to 10 nm, inclusive may be formed as the film 406 having the low wettability in the present invention. Note that the film 406 having the low wettability can be formed with a thickness in the range from 0.3 nm to 10 nm, inclusive by a spin coat method or the like.

In this embodiment mode, FAS is used as a material of the film 406 having the low wettability.

Figure 4C:
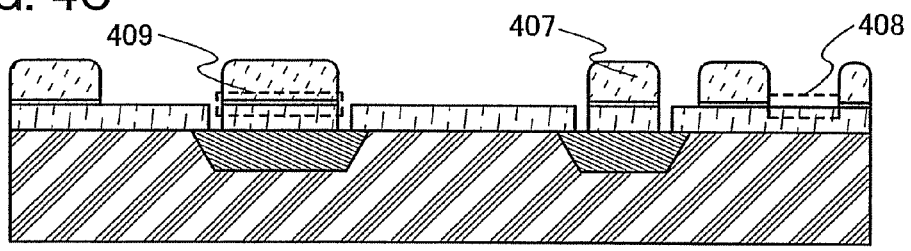

Next, a part of the film 406 having low wettability is decomposed by being irradiated with light using a photo mask 407 corresponding to a pattern of a wiring to be formed later (see FIG. 4C). As a result, a functional group having polarity such as an OH group or a COOH group is introduced to a surface of the protective film 405. The surface of the region corresponding to the pattern of the wiring becomes a lyophilic region. Accordingly, surfaces having different wettabilities (a lyophilic region 408 and a liquid repellent region 409) exist on the surface of the same substrate in accordance with the pattern of the wiring.

The light may be light having energy high enough to decompose the film 406 having low wettability. Light emitted from a lamp or a laser can be used as appropriate. Here, the film 406 having low wettability is irradiated with vacuum ultraviolet light (VUV light) to decompose a part of FAS, thereby forming the lyophilic region 408 and the liquid repellent region 409.

The photo mask 407 is removed, and then a composition is discharged by using a droplet discharging means. The composition is discharged onto a surface of the lyophilic region 408 formed in advance in accordance with the wiring pattern. The droplet discharging means is a generic term for means for discharging a droplet, such as a nozzle having a discharge outlet for discharging the composition or a head equipped with one or more nozzles. The nozzle of the droplet discharging means has a diameter of 0.02 to 100 μm (preferably 0.05 to 30 μm) and the amount of the composition to be discharged from the nozzle is in the range of 0.001 to 100 pl (preferably 0.01 to 10 pl). The amount of the discharged composition increases proportionally with the diameter of the nozzle. The distance between a process object and the discharge outlet of the nozzle is preferably as small as possible in order to discharge the composition at a desired position, about 0.05 to 3 mm (preferably 0.1 to 1 mm).

Figure 5:
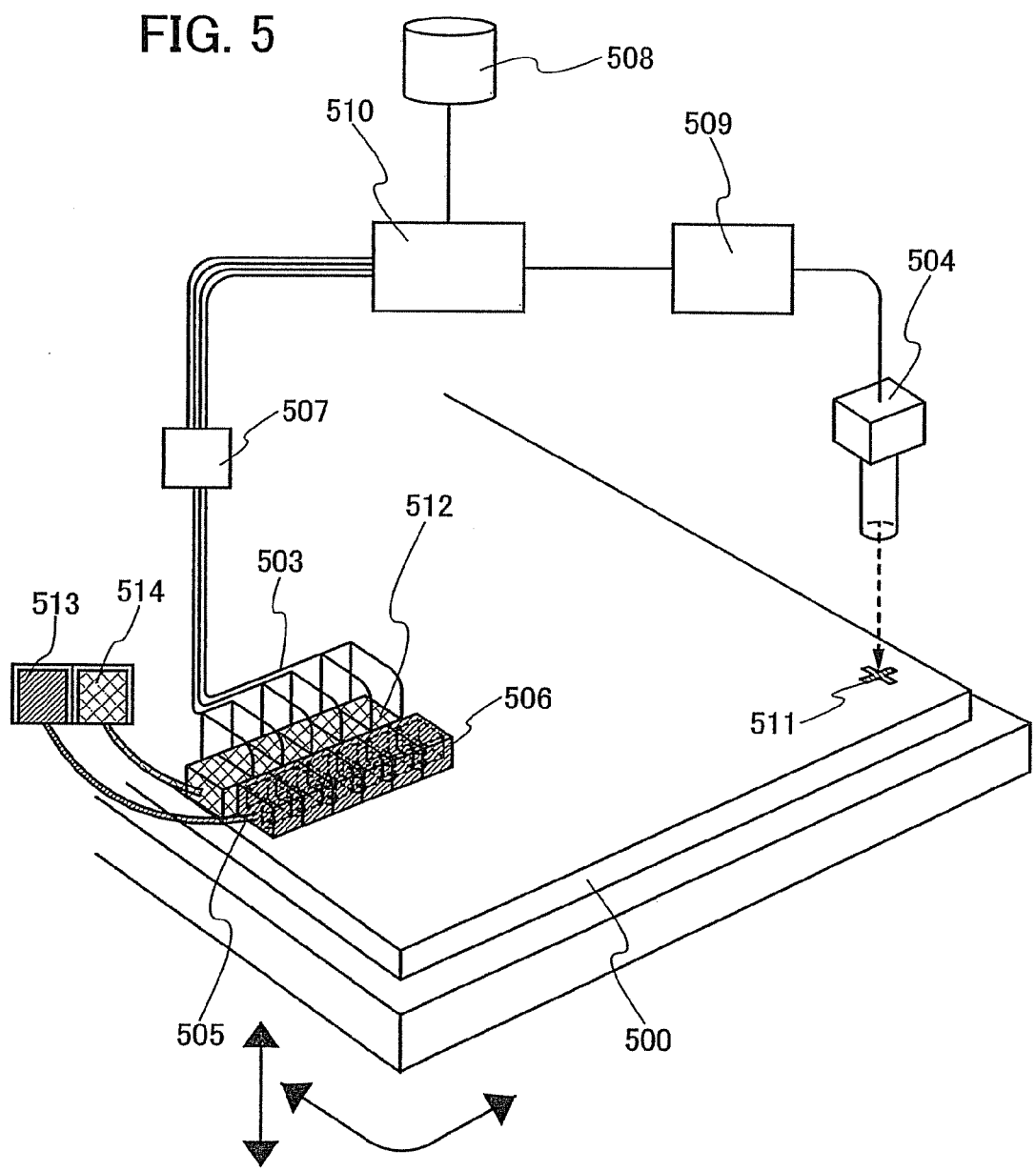
FIG. 5 is a diagram showing a droplet discharging means which is used in the present invention.

FIG. 5 shows one example of the apparatus used for droplet discharging. Each head 505 of a droplet discharging means 503 is connected to a control unit 507. By controlling the control unit 507 using a computer 510, a pattern that has been programmed in advance can be drawn. A timing of drawing may be determined, for example, on the basis of a marker 511 formed over a substrate 500. Alternatively, a base point may be determined on the basis of the edges of the substrate 500. This is detected by an image pickup unit 504 such as a CCD, and converted into a digital signal by an image processing unit 509. The computer 510 recognizes the digital signal and generates a control signal and the control signal is sent to the control unit 507. Data on a pattern to be formed over the substrate 500 is stored in a memory medium 508, on the basis of this information, a control signal is sent to the control unit 507 and thus each head 505 of the droplet discharging means 503 can be controlled. A material to be discharged is supplied to the heads 505 and 512 from material supply sources 513 and 514 through pipes respectively.

In the head 505, there are a space filled with a liquid material as shown by dotted lines 506, and a nozzle that is a discharge outlet. Although not shown in the drawings, the head 512 has a similar inner structure to the head 505. A conductive material, an organic material, an inorganic material, or the like can be discharged individually through one head to draw a pattern. When a pattern is drawn in a large area like an interlayer film, the same material can be discharged at the same time through a plurality of nozzles so that throughput can be improved. In the case of using a large substrate, the head 505 can scan freely over the substrate, and therefore, the area to be drawn can be set freely. Accordingly, a plurality of same patterns can be drawn over one substrate.

As the composition to be discharged from the droplet discharging means, a liquid substance in which conductive particles are dissolved or dispersed in a solvent is used. The conductive particle corresponds to a microparticle or a dispersive nanoparticle of metal such as silver (Ag), gold (Au), copper (Cu), nickel (Ni), platinum (Pt), palladium (Pd), iridium (Ir), rhodium (Rh), tungsten (W), or aluminum (Al). Moreover, a composition containing indium tin oxide (ITO), indium tin oxide containing silicon oxide, zinc oxide, or the like, which have a light-transmitting property, may be discharged. However, in consideration of a specific resistance value, it is preferable to use a solvent in which gold, silver, or copper is dissolved or dispersed for a composition to be discharged from the discharge outlet. It is more preferable to use silver or copper, which has lower resistance. When silver or copper is used, a film having a barrier property is preferably provided as a countermeasure against impurities. As the solvent, water, esters such as butyl acetate or ethyl acetate, alcohols such as isopropyl alcohol or ethyl alcohol, an organic solvent such as methyl ethyl ketone or acetone, or the like is used.

Here, the composition is a liquid substance in which Ag nanoparticles are dispersed in a solvent (this liquid substance is hereinafter referred to as Ag paste). The composition needs to be sufficiently repelled in the liquid repellent region 409 and to sufficiently wet the lyophilic region 408. Therefore, in order to fill a contact hole having a high aspect ratio with the composition, the contact angle on the surface of the lyophilic region is preferably smaller. Accordingly, it is preferable to select the solvent and the amount of solutes so that the contact angle of the liquid substance on the surface of the liquid repellent region ranges from 60° to 160° (more preferably 90° to 160°) and the contact angle of the liquid substance on the surface of the lyophilic region is 0° to 20° (more preferably 0° to 10°).

Figure 4D:
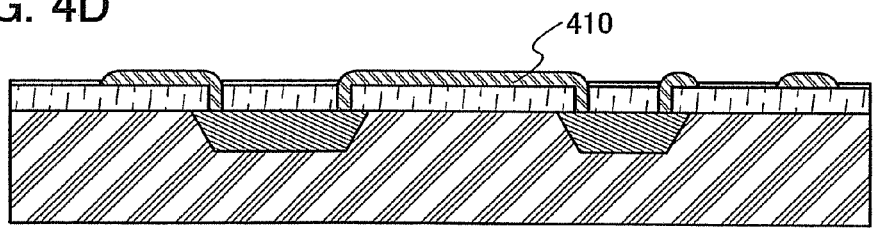

After discharging the composition, one or both of drying and baking steps are conducted to form a wiring 410 (see FIG. 4D). Although both of the drying and baking steps are heat treatments, the purpose, the temperature, and the time are different. For example, the drying step is performed for 2 to 4 minutes at 80 to 100° C., and the baking step is performed for 15 to 30 minutes at 150 to 300° C. The drying and baking steps are conducted under normal pressure or low pressure by laser irradiation, rapid thermal annealing (RTA), a heat furnace, or the like. The timing for conducting this heat treatment is not limited in particular. In order to conduct the drying and baking steps favorably, the substrate may be heated at 100 to 300° C. (preferably 150 to 250° C.) though the temperature depends on the property of the material of the substrate or the like. This step volatilizes the solvent in the composition or removes a dispersing agent chemically. At the same time, peripheral resin is cured and shrunk to make the nanoparticles in contact with each other and to accelerate the fusion and welding of the nanoparticles. Note that in order to have a good connection between an electrode of the IC chip and the wiring 410, a connecting portion using a material such as gold (Au) may be formed after the opening is formed. Alternatively, the IC chip is disposed on the base, and then a similar connecting portion may be formed before providing the protective film 405. It is needless to say that a connecting portion using a material such as gold (Au) may be formed in advance when forming the IC chip.

Further, the composition may be discharged multiple times onto the same position until the thickness becomes desired one. Even in this case, since the liquid repellent region is formed in advance as the wiring pattern, the wiring 410 is formed only over the lyophilic region 408 and the composition does not spread beyond the designed line width. For this reason, the wiring 410 formed by baking the composition has a fine line width.

After the discharged composition is dropped on the substrate, the composition remains liquid until the composition is dried. In the case where the composition is introduced into the contact hole with an opening having a high aspect ratio, the side surface of the contact hole has a high lyophilic property; therefore, the contact hole can be sufficiently filled.

After a wiring is formed by these steps, a wiring defect is preferably checked. The defect checking is performed by selecting a desired terminal or wiring and observing an electric property. For example, the wiring checking may be performed by confirming whether end portions of the desired wiring are electrically connected. In addition, for example, the checking of an electrically-connected condition between wirings may be performed by selecting at least two wirings which form a desired connecting portion and confirming whether the wirings are electrically connected. When a defect is found by checking, a yield can be improved by passing through a restoration process which is described later and then proceeding to a next step. Note that when a defect is not found, the next step may be performed.

Next, the film 406 having low wettability in the liquid repellent region 409 is removed with a UV ozone cleaner or the like. The film 406 having low wettability is not necessarily removed; however, the film 406 having low wettability is preferably removed in terms of improving adhesion with a layer formed over the protective film or the conductive film, or the like. In this embodiment mode, a structure having a single layer of a wiring is shown; however, it is not limited to this structure, and a structure having a multilayer interconnection may be used. In this case, an insulating film (it is preferably porous) is formed further, and a wiring may be formed over the insulating film through a similar step.

Figure 4E:
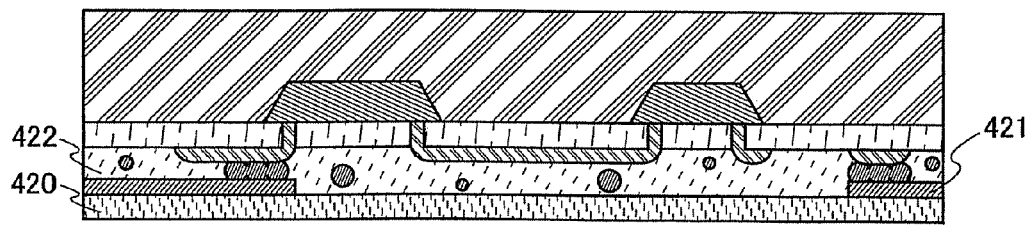

Next, a base 420 provided with a conductive layer 421 functioning as an antenna is pressure-bonded to the base 400 using an anisotropic conductive material 422 (see FIG. 4E). As the anisotropic conductive material 422, an anisotropic conductive paste (ACP) which is heat cured or an anisotropic conductive film (ACF) which is heat cured can be used. The anisotropic conductive paste is referred to as a binder layer, and has a structure in which conductive particles are dispersed in a layer containing an adhesive agent as its main component. The anisotropic conductive film has a structure in which conductive particles are dispersed in a thermoset resin film or a thermoplastic resin film. Note that a spherical resin on which nickel (Ni), gold (Au) or the like is plated is used as the conductive particles. In order to prevent electrical short-circuit between the conductive particles at a portion in which an electrically connection is not required, an insulating property containing silica or the like may be mixed. In this embodiment mode, an anisotropic conductive paste is used as the anisotropic conductive material 422.

The conductive layer 421 over the base 420 can be formed by a plasma CVD method, a sputtering method, a printing method, a droplet discharging method, or the like. Preferably, an element selected from aluminum (Al), titanium (Ti), silver (Ag), or copper (Cu), or an alloy or compound material containing such an element as its main component, is used to form the conductive layer 421 in a single layer or a laminated layer. Specifically, the conductive layer 421 is formed using a paste containing silver by a screen printing method, and then heat treatment is performed at a temperature of 50 to 350° C. Alternatively, an aluminum layer is formed by a sputtering method and the aluminum layer is patterned to form the conductive layer 421. The patterning of the aluminum layer is preferably performed by a wet etching process, and heat treatment is preferably performed at a temperature of 150 to 300° C. after the wet etching process.

In accordance with the above-described steps, a semiconductor device in which a plurality of IC chips are used and a wiring is formed by a droplet discharging method can be formed.

Next, a semiconductor device which is obtained in accordance with the steps of this embodiment mode, and a restoration method of the semiconductor device are described with reference to FIGS. 6A and 6B.

Figure 6A:
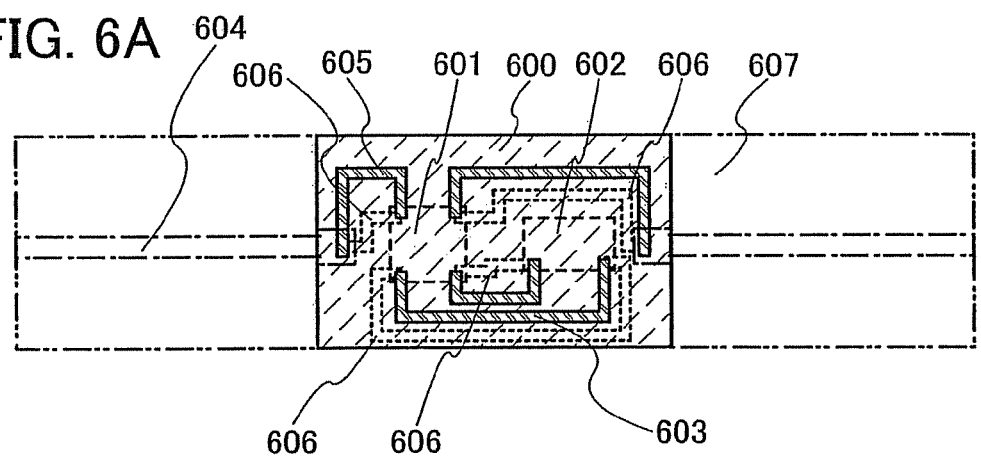
FIGS. 6A and 6B are diagrams showing a restoration process of a semiconductor device of the present invention.
Figure 6B:
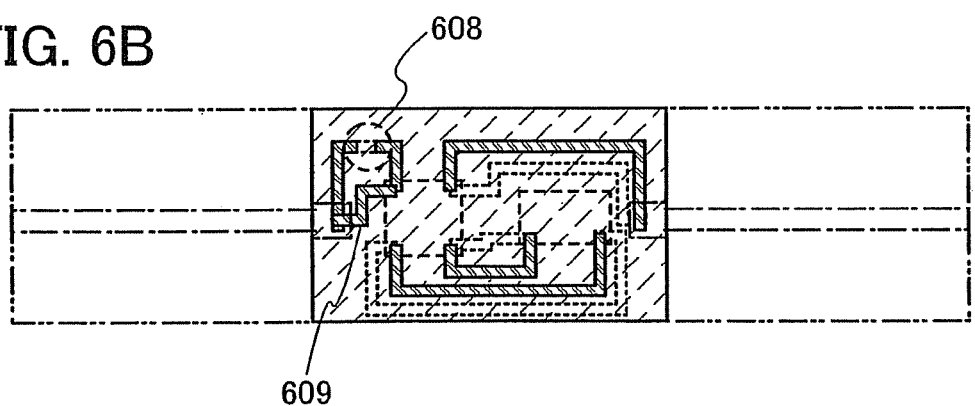

FIG. 6A shows a semiconductor device having a structure in which an IC chip 601 and an IC chip 602 are disposed on a base 600. The IC chip 601 and the IC chip 602 are electrically connected to each other through a wiring 603. Between the IC chip 601 and a region 604 where a linear shaped antenna is formed, a wiring 605 is formed for electrically connecting the IC chip 601 and the linear shaped antenna. Note that a region 606 shown by dotted lines in FIG. 6A is a lyophilic region which has been formed in advance in consideration of the case where a new wiring is provided. In addition, the IC chip 601 and the IC chip 602 are shown by dashed lines, the region where the antenna is formed is shown by alternate long and short dash lines, and a base 607 having the antenna is shown by alternate long and two short dashes lines.

Next, for example, a case where a defect 608 is generated in the wiring 605 formed between the IC chip 601 and the region 604 in which the antenna is to be formed is considered. At this time, when the defect 608 is eliminated by forming a new wiring again in the same region, a wiring may be formed again in the same region. On the other hand, when a defect is not eliminated even by forming a wiring in the same region, or when a wiring cannot be formed in the same region, or the like due to defects of the base or the protective film or the like, a new wiring 609 is formed in another lyophilic region 606 which has been formed in advance (see FIG. 6B). In this manner, a spare wiring region is formed in advance, and restoration of a defect due to a wiring can be easily performed by a droplet discharging method.

As described in this embodiment mode, restoration of a defect due to a wiring can be easily performed by a droplet discharging method. At this time, a spare wiring region (lyophilic region) is formed in advance, restoration of a defect due to a wiring can be more easily performed. In addition, a plurality of IC chips depending on each function are used, and thus an IC chip having a desired function is not required to be redesigned. Therefore, a semiconductor device of which cost is reduced can be manufactured. Since a combination of IC chips can be easily modified, a semiconductor device having a required function can be provided immediately.

Note that this embodiment mode can be combined as appropriate with Embodiment Mode 1.

(Embodiment Mode 3)

In this embodiment mode, a manufacturing method of a semiconductor device using a plurality of IC chips, particularly a manufacturing method of an RPM tag is described below with reference to FIGS. 7A to 8F, when a protruding portion is formed in a depression of a base for enabling restoration.

Figure 7A:
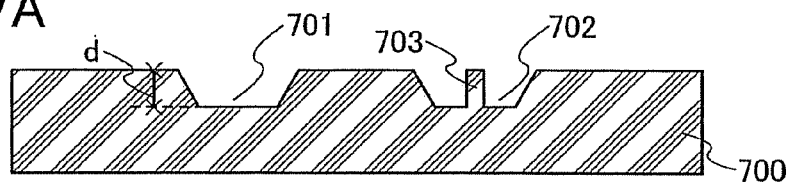
FIGS. 7A to 7G are diagrams showing a manufacturing process of a semiconductor device of the present invention.

First, in a base 700, a depression 701, and a depression 702 having a protruding portion 703 are formed (see FIG. 7A). In this embodiment mode, since it matters whether there is the protruding portion 703 or not, the shapes and the sizes of the depression 701 and the depression 702 are equal to each other except for the protruding portion 703. As a material of the base 700, a synthetic resin having flexibility such as plastic which is typified by polyethylene terephthalate (PET), polyethylene naphthalate (PEN), or polyethersulfone (PES), or acrylic can be used. The depression 701 and the depression 702 can be formed using an embossing machine, a punching machine, a laser ablation, an FIB (Focused Ion Beam), or the like.

The depression 701 and the depression 702 are formed to have the same shape and the size; however, it is not limited to this, and another depression having different shape may be provided. The depression having a protruding portion is provided because an IC chip is not disposed in a specific depression when an IC chip is disposed at the first time. In this embodiment mode, only two depressions 701 and 702 are shown; however, the number of depressions is not particularly limited, and a required number of depressions may be formed in order to manufacture a semiconductor device having a desired function. At this time, so as to correspond to respective depressions, depressions having protruding portions are preferably formed.

Figure 7B:
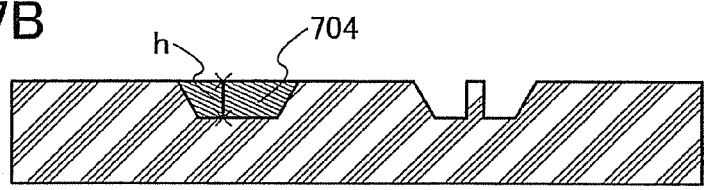

Next, the base 700 provided with the depression 701 and the depression 702 is dipped into a suspension in which IC chips are dispersed in liquid, an IC chip 704 is disposed in the depression 701 (see FIG. 7B). Since the depression 702 has the protruding portion 703, an IC chip is not disposed. Here, the IC chip 704 has a shape and a size which fit the depression 701 formed in the base 700. The IC chips and the depression are formed so that a height "h" of the IC chip 704 (see FIG. 7B) and a depth "d" of the depression 701 are almost equal to each other (see FIG. 7A). Note that a size of the IC chip can be set about 0.5 μm to 5 mm on a side.

A manufacturing method of the IC chip 704 is not particularly limited. As a material, a silicon (Si) substrate, a silicon germanium (SiGe) substrate, a gallium arsenic (GaAs) substrate, or the like is preferably used. An SOI (Silicon On Insulator) substrate, a quartz substrate, or a glass substrate can be used. A liquid which is used for the suspension is not particularly limited. As long as a material does not deteriorate IC chips, the material can be used; for example, water, alcohol, fats and oils, or the like can be used. When selecting liquid, specific gravity, viscosity, or the like may be considered.

Disposition of the IC chip is performed by gravity applied to the IC chip; however, some kind of external force may be applied for promoting disposition. For example, vibration such as an ultrasonic wave may be applied to the suspension or the base. The suspension is removed at a stage where IC chips are disposed in almost all of depressions by the above-described steps. Here, the phrase "almost all of depressions" refers to about 70 to 100% of the entire depressions for example. However, the phrase "almost all of depressions" is not limited to this because the depressions can be arbitrarily set based on a required throughput, or the like. Note that depressions in which IC chips are not disposed are detected using appropriate detecting means (e.g., a CCD camera) or the like and IC chips are mechanically disposed using a flip chip mounting method or the like. The removed suspension is collected and recycled.

Note that a memory, a CPU, an RF circuit, a controller circuit, or the like can be included in a function of the IC chip; however, the function is not limited to them. In addition, one kind or plural kinds of functions may be included in one IC chip.

Figure 7C:
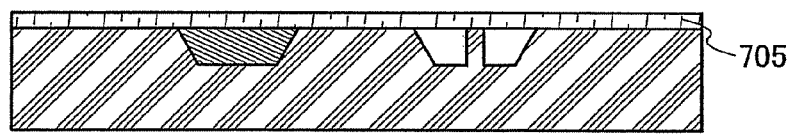

Next, a protective film 705 is provided so as to cover the base 700 and the IC chip 704 (see FIG. 7C). Here, as the protective film 705, a material having an optical gap different from that of the base 700 is preferably used, because a part of the protective film should be removed when the semiconductor device is restored. Compared to the optical gap included in the base 700, the optical gap of the protective film is reduced, so that only the protective film can be removed by using a laser beam or the like without giving damage to the base. That is, light having a wavelength which is higher optical absorption of the protective film than that of the base is used, so that only the protective film can be removed. As a step of removing the protective film, since a step using a mechanical punching process or an FIB (Focused Ion Beam), or the like can be used, the present invention is not limited to using a protective film having a small optical gap. In addition, a planarizing film may be formed instead of the protective film. Since the planarizing film is formed using a material such as photopolymer (photo resist), the planarizing film is easily removed selectively. Note that the planarizing film can be formed by a method such as a spin coat method. As the step of restoring the semiconductor device, detail description is done later.

Next, the protective film 705 is irradiated with a laser beam or an FIB or by a mechanical punching process or the like, thereby forming an opening. This opening is formed on a portion corresponding to an electrode of the IC chip. In the case where the planarizing film is formed instead of the protective film 705, a mask is formed so as to remove the portion corresponding to the electrode of the IC chip, and etching is performed.

Figure 7D:
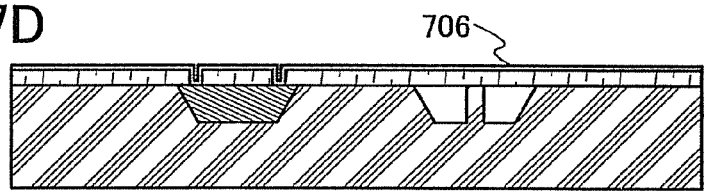

After the opening is formed in the protective film 705, a film 706 having low wettability is formed using a material and a method which are similar to Embodiment Mode 2 (see FIG. 7D). The film having low wettability, that is, a film having liquid repellency is formed, and a lyophilic region and a liquid repellent region are formed in a step shown later. Therefore, a wiring having a desired shape can be formed by a droplet discharging method.

Note that as the protective film 705, a material having a porous surface is more preferably used. This is because since the protective film to become a lyophilic region later has the porous surface, a contact area between a composition which is used for a droplet discharging method and a surface of the protective film is increased, and adhesion can be improved.

Figure 7E:
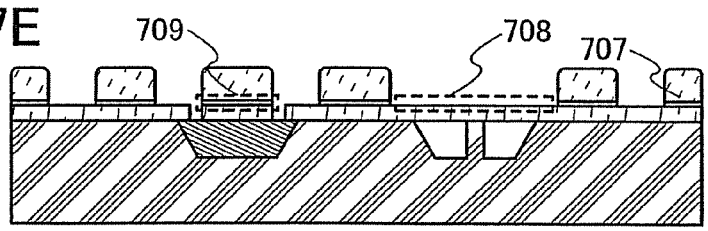

Next, a part of the film 706 having low wettability is decomposed by being irradiated with light using a photo mask 707 corresponding to a pattern of a wiring to be formed later (see FIG. 7E). As a result, a functional group having polarity such as an OH group or a COOH group is introduced to the surface of the protective film 705. The surface of the region corresponding to the pattern of the wiring becomes a lyophilic region. Accordingly, surfaces having different wettabilities (a lyophilic region 708 and a liquid repellent region 709) exist on the surface of the same substrate in accordance with the pattern of the wiring. At this time, the film 706 having low wettability is preferably removed in a region where a wiring is formed when the wiring is restored later.

The light may be light having energy high enough to decompose the film 706 having low wettability. Light emitted from a lamp or a laser can be used as appropriate. Here, the film 706 having low wettability is irradiated with vacuum ultraviolet light (VUV light) to decompose a part of the film 706, thereby forming the lyophilic region 708 and the liquid repellent region 709.

Figure 7F:
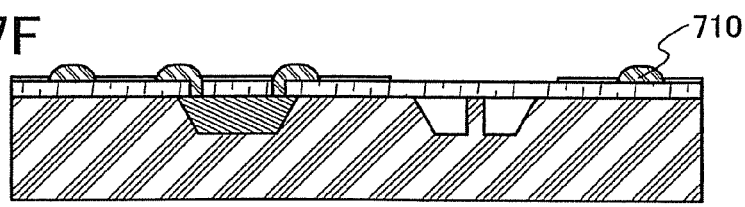

Next, after the photo mask 707 is removed, a composition (Ag paste) is discharged using a droplet discharging means to form a wiring 710 similarly to Embodiment Mode 2 (see FIG. 7F). In order to have a good connection between the electrode of the IC chip and the wiring 710, a connecting portion using a material such as gold (Au) may be formed after the opening is formed. Alternatively, the IC chip is disposed on the base, and then a similar connecting portion may be formed before providing the protective film 705. It is needless to say that a connecting portion using a material such as gold (Au) may be formed in advance when forming the IC chip.

After the wiring is formed by this step, defects of the wiring and the IC chip are preferably checked. The defect checking is performed by selecting a desired terminal or wiring and observing an electric property. For example, the wiring checking may be performed by confirming whether end portions of the desired wiring are electrically connected. In addition, for example, the checking of an electrically-connected condition between wirings may be performed by selecting at least two wirings which form a desired connecting portion and confirming whether the wirings are electrically connected. When a defect is found by checking, a yield can be improved by passing through a restoration process which is described later and then proceeding to a next step. Note that when a defect is not found, the next step may be performed.

Next, the film 706 having low wettability in the liquid repellent region 709 is removed with a UV ozone cleaner or the like. The film 706 having low wettability is not necessarily removed; however, the film 706 having low wettability is preferably removed in terms of improving adhesion with a layer formed over the protective film or the conductive film, or the like. In this embodiment mode, a structure having a single layer of a wiring is shown; however, it is not limited to this structure, and a structure having a multilayer interconnection may be used. In this case, an insulating film (it is preferably porous) is formed further, and a wiring may be formed over the insulating film through similar steps.

Figure 7G:
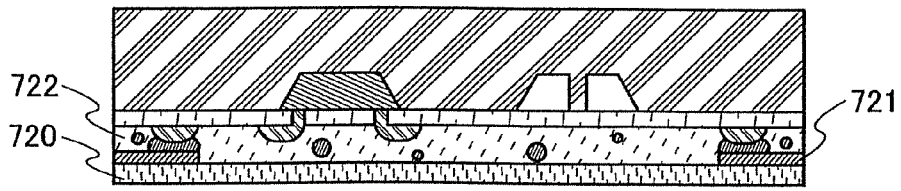

Next, a base 720 provided with a conductive layer 721 functioning as an antenna is pressure-bonded to the base 700 using an anisotropic conductive material 722 (see FIG. 7G). As the anisotropic conductive material 722, an anisotropic conductive paste (ACP) which is heat cured or an anisotropic conductive film (ACF) which is heat cured can be used. The anisotropic conductive paste is referred to as a binder layer, and has a structure in which conductive particles are dispersed in a layer containing an adhesive agent as its main component. The anisotropic conductive film has a structure in which conductive particles are dispersed in a thermoset resin film or a thermoplastic resin film. Note that a spherical resin on which nickel (Ni), gold (Au) or the like is plated is used as the conductive particles. In order to prevent electrical short-circuit between the conductive particles at a portion in which an electrically connection is not required, an insulating property containing silica or the like may be mixed. In this embodiment mode, an anisotropic conductive paste is used as the anisotropic conductive material 722.

The conductive layer 721 over the base 720 can be formed by a plasma CVD method, a sputtering method, a printing method, a droplet discharging method, or the like. Preferably, an element selected from aluminum (Al), titanium (Ti), silver (Ag), or copper (Cu), or an alloy or compound material containing such an element as its main component, is used to form the conductive layer 721 in a single layer or a laminated layer. Specifically, the conductive layer 721 is formed using a paste containing silver by a screen printing method, and then heat treatment is performed at a temperature of 50 to 350° C. Alternatively, an aluminum layer is formed by a sputtering method and the aluminum layer is patterned to form the conductive layer 721. The patterning of the aluminum layer is preferably performed by a wet etching process, and heat treatment is preferably performed at a temperature of 150 to 300° C. after the wet etching process.

In accordance with the above-described steps, a semiconductor device in which a plurality of IC chips are used and a wiring is formed by a droplet discharging method can be formed.

Next, a semiconductor device which is obtained in accordance with the steps of this embodiment mode, and a restoration method of the semiconductor device are described with reference to FIGS. 8A to 8F.

Figure 8A:
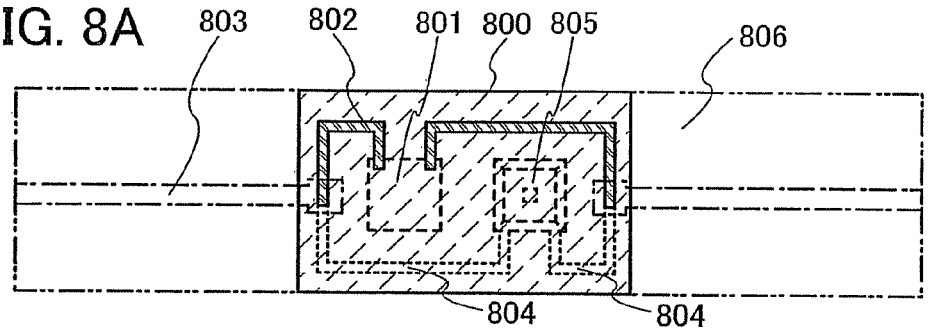
FIGS. 8A to 8F are diagrams showing a restoration process of a semiconductor device of the present invention.
Figure 8B:
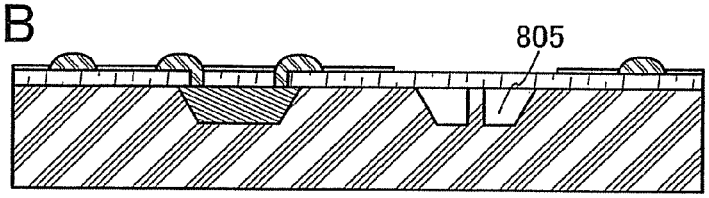

FIG. 8A shows a semiconductor device having a structure in which an IC chip 801 is disposed on a base 800. Between the IC chip 801 and a region 803 where a linear shaped antenna is formed, a wiring 802 is formed for electrically connecting the IC chip 801 and the linear shaped antenna. Note that a region 804 shown by dotted lines in FIG. 8A is a lyophilic region which has been formed in advance, and a region 805 shows a depression having a protruding portion. In addition, the region 803 where the antenna is formed is shown by alternate long and short dash lines, and a base 806 having the antenna is shown by alternate long and two short dashes lines. FIG. 8B shows a cross section of FIG. 8A.

Figure 8C:
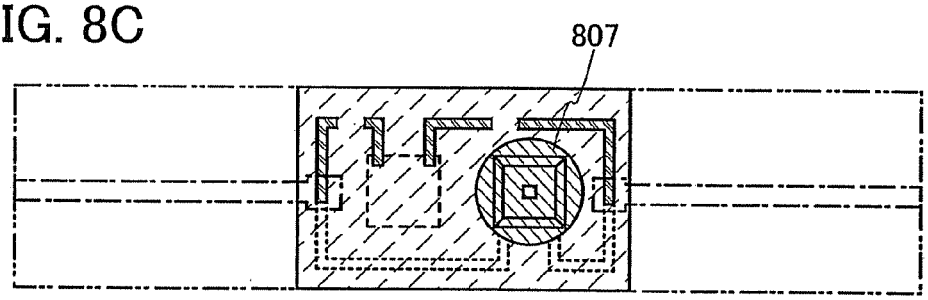

When a defect is generated in the IC chip or the wiring, the protective film which is over a depression having a protruding portion is removed in order to provide a new IC chip (see FIG. 8C). In this case, the wiring 802 connected to the IC chip 801 may be cut. As a method of removing the protective film, irradiation with a laser beam, an FIB (Focused Ion Beam) or the like, a mechanical punching process, or the like can be used. In this embodiment mode, the protective film can be removed with a laser beam by using a difference between optical gaps of the base and the protective film. That is, light having a wavelength which is higher optical absorption of the protective film than that of the base is used, so that only the protective film can be removed. Note that a region 807 in the drawing is a region in which the protective film is removed.

Figure 8D:
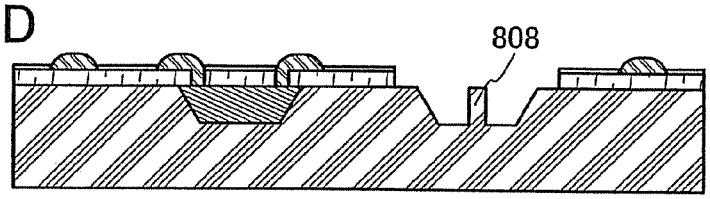
Figure 8E:
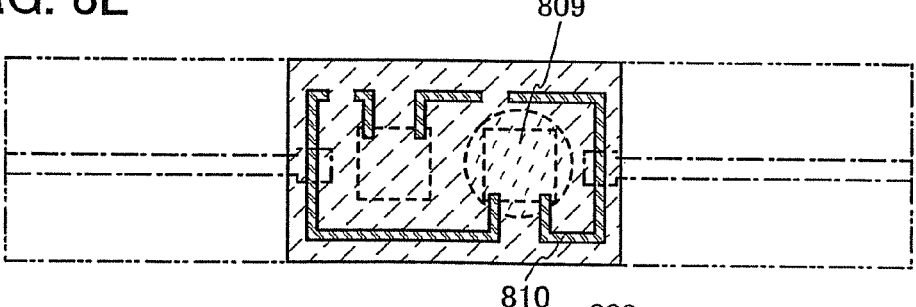
Figure 8F:
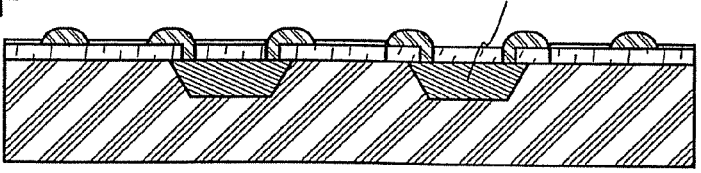

FIG. 8D is a cross sectional diagram of FIG. 8C, and shows a state that the protective film is removed. As shown in the diagram, the protective film is removed, and then a protruding portion 808 is removed. As a method of removing the protruding portion, irradiation with a laser beam, an FIB or the like, a mechanical removal process, or the like can be used. In this embodiment mode, the protruding portion 808 is removed by using a laser beam which has a wavelength different from a laser beam which is used when the protective film is removed. However, it is not limited to this.

Next, an IC chip 809 which is similar to the IC chip 801 is disposed in the depression in which the protruding portion 808 is removed. As a method of disposing the IC chip 809, a method which is used when the IC chip 801 is disposed (FSA or flip chip mounting method), or the like can be used. After the IC chip 809 is disposed, a protective film or a planarizing film is formed so as to cover the IC chip 809 (see FIGS. 8E and 8F). In this embodiment mode, although the planarizing film is formed, the present invention is not limited to this. Note that the planarizing film can be formed only on the portion in which the protective film is removed by a droplet discharging method or the like, which is preferable.

Next, an opening is formed in the planarizing film over the IC chip 809, and a wiring 810 is formed. In this embodiment mode, a film having low wettability is not formed over the planarizing film; however, the present invention is not limited to this, and a film having low wettability may be formed. In this way, a semiconductor device can be restored.

In this embodiment mode, a method in which a new IC chip 809 is disposed is described; however, the restoration method is not limited to this. In the case where the IC chip 801 is not a cause of a defect, restoration may be performed by forming a new wiring for the IC chip 801, as described in Embodiment Mode 2.

As show in this embodiment mode, a depression having a protruding portion is formed, so that restoration can be easily performed when a defect is generated in the IC chip or the wiring. Accordingly, a yield can be improved. In addition, a spare wiring region (lyophilic region) is formed, restoration of a defect due to the wiring can be easily performed by a droplet discharging method, and a yield can be improved. In addition, a plurality of IC chips depending on each function are used, and an IC chip having a desired function is not required to be redesigned. Therefore, a semiconductor device of which cost is reduced can be manufactured. Since a combination of IC chips can be easily modified, a semiconductor device having a required function can be provided immediately.

Note that this embodiment mode can be combined as appropriate with Embodiment Modes 1 and 2.

(Embodiment Mode 4)

In this embodiment mode, a manufacturing method of a semiconductor device using a plurality of IC chips, particularly a manufacturing method of an RFID tag is described below with reference to FIGS. 9A to 10B when an antenna is formed over a base provided with the IC chip. Note that steps up to and including the state shown in FIG. 1B of Embodiment Mode 1 can be similarly used in this embodiment mode; therefore, detail description is omitted. In addition, a depression having a protruding portion may be formed, as described in Embodiment Mode 3.

Figure 9A:
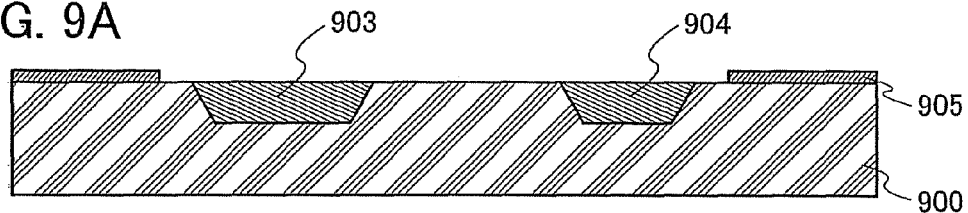
FIGS. 9A to 9E are diagrams showing a manufacturing process of a semiconductor device of the present invention.

The state shown in FIG. 1B of Embodiment Mode 1 is formed, and then a conductive layer 905 functioning as an antenna is formed over a base 900 (see FIG. 9A). Note that the base 900, an IC chip 903, and an IC chip 904 in FIG. 9A correspond to the base 100, the IC chip 103, and the IC chip 104 in FIG. 1, respectively.

The conductive layer 905 can be formed by a plasma CVD method, a sputtering method, a printing method, a droplet discharging method, or the like. Preferably, an element selected from aluminum (Al), titanium (Ti), silver (Ag), or copper (Cu), or an alloy or compound material containing such an element as its main component, is used to form the conductive layer 905 in a single layer or a laminated layer. Specifically, the conductive layer 905 is formed using a paste containing silver by a screen printing method, and then heat treatment is performed at a temperature of 50 to 350° C. Alternatively, an aluminum layer is formed by a sputtering method and the aluminum layer is patterned to form the conductive layer 905. The patterning of the aluminum layer is preferably performed by a wet etching process, and heat treatment is preferably performed at a temperature of 150 to 300° C. after the wet etching process.

Figure 9B:
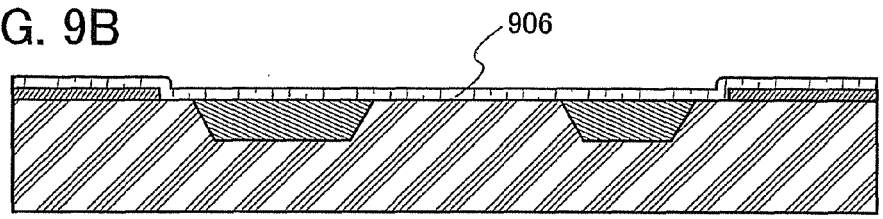

Next, as a protective film 906 is attached so as to cover the base 900, the IC chip 903, the IC chip 904, and the conductive layer 905 (see FIG. 9B). Here, a planarizing film may be formed instead of the protective film 906. The planarizing film can be formed using a material such as photopolymer (photo resist) by a method such as a spin coat method.

Figure 9C:
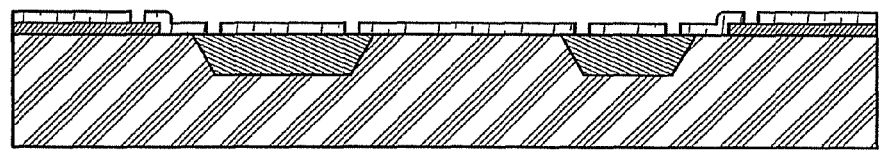

Next, the protective film 906 is irradiated with a laser beam or an FIB (Focused Ion Beam) or by a mechanical punching process or the like, thereby forming an opening (see FIG. 9C). This opening is formed on a portion corresponding to an electrode of the IC chip. In the case where a planarizing film is formed instead of the protective film 906, a mask is formed so as to remove the portion corresponding to the electrode of the IC chip, and etching is performed.

Figure 9D:
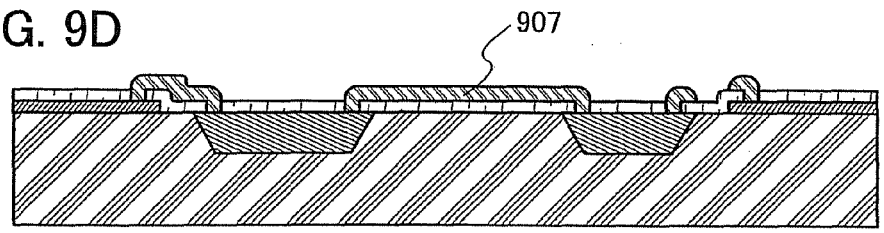

The opening is formed in the protective film 906, and then a wiring 907 is formed so as to be electrically connected to the electrode of the IC chip and an antenna (see FIG. 9D). Silver (Ag) is preferable as a material of the wiring. However, the material is not limited to this, and a conductive element such as gold (Au), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), or tantalum (Ta), or an alloy or compound material containing such an element as its main component, or the like can be used. As a forming method, an evaporation method, a sputtering method, a CVD method, a printing method, a droplet discharging method, or the like can be used. The droplet discharging method described in Embodiment Mode 2 or Embodiment Mode 3 is used in this embodiment mode to form the wiring and the detailed description is omitted.

Figure 9E:
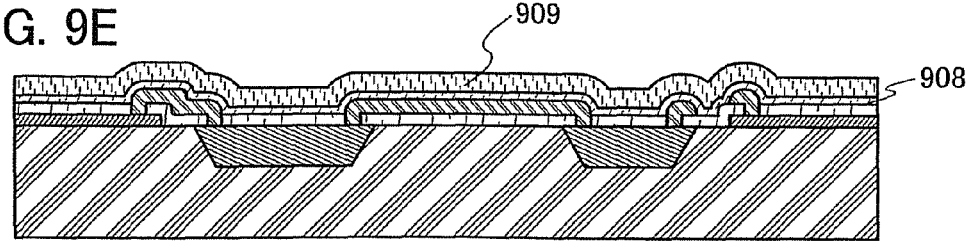

Next, a film 909 having an adhesive layer 908 is bonded so as to cover the conductive layer 905, the protective film 906, and the like (FIG. 9E). As the film 909, a film formed of polypropylene, polyester, vinyl, polyvinyl fluoride, vinyl chloride, polyamide, or the like, papers made from fibrous material, another base material film (inorganic vapor deposition film or the like), or the like can be used. As the adhesive layer 908, an adhesive synthetic resin film (an acrylic-based synthetic resin, an epoxy-based synthetic resin, or the like), or the like can be used. The adhesion of the film 909 is performed by thermo compression bonding.

In accordance with the above-described steps, a semiconductor device provided with an antenna over the base 900 can be formed.

Next, a semiconductor device which is obtained in accordance with the steps of this embodiment mode is described with reference to FIGS. 10A and 10B.

Figure 10A:
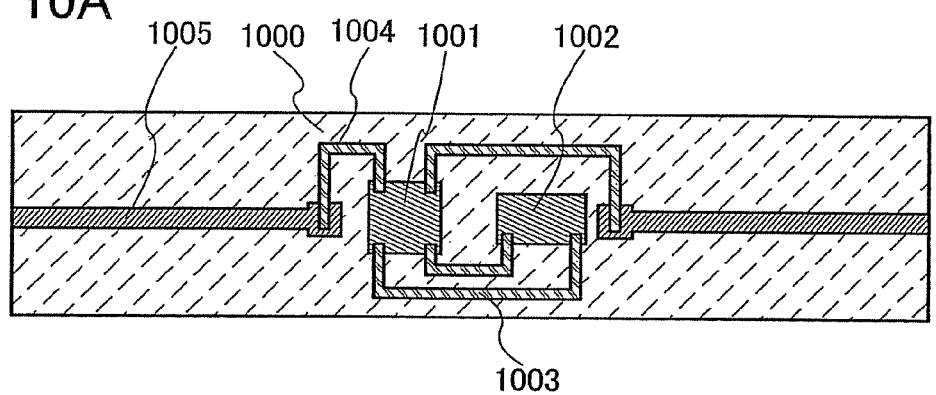
FIGS. 10A and 10B are diagrams showing a semiconductor device of the present invention.

FIG. 10A shows a semiconductor device in which an IC chip 1001 and an IC chip 1002 are disposed on a base 1000. The IC chip 1001 and the IC chip 1002 are electrically connected to each other through a wiring 1003. A linear shaped antenna 1005 is connected to the IC chip 1001 through a wiring 1004. Note that the antenna 1005, the IC chip 1001, and the IC chip 1002 are under a film; however, the film is not shown here because of simplification.

Figure 10B:
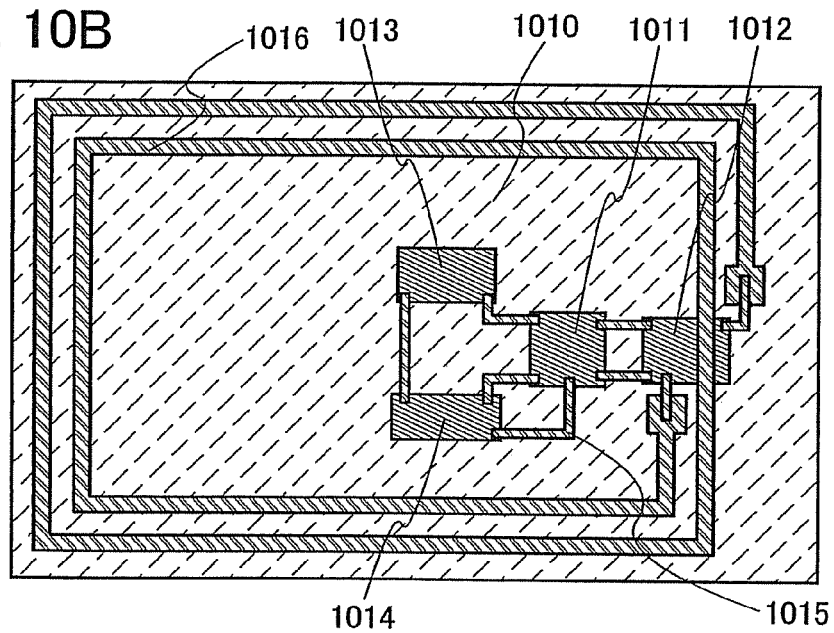

FIG. 10B shows a semiconductor device having a structure in which four IC chips of an IC chip 1011, an IC chip 1012, an IC chip 1013, and an IC chip 1014 are disposed on a base 1010. The IC chips are electrically connected to one another through a wiring 1015. A spiral antenna 1016 is connected to the IC chip 1012 through the wiring 1015. Note that the antenna 1016, the IC chip 1011, the IC chip 1012, the IC chip 1013, and the IC chip 1014 are under a film; however, the film is not shown here because of simplification.

As described in this embodiment mode, by forming an antenna over the base provided with the IC chip, connection between the antenna and the wiring is performed without using an anisotropic conductive material; thereby reducing a contact defect and suppressing the increase of resistance. In addition, the antenna and the wiring are formed over the same base, and a yield depending on alignment during attachment of the antenna can be prevented from being reduced. Moreover, as described in Embodiment Mode 2 or Embodiment Mode 3, a spare wiring region (lyophilic region) is formed, restoration of a defect due to the wiring can be easily performed by a droplet discharging method, and a yield can be improved. Further, by using a plurality of IC chips each categorized according to function, and an IC chip having a desired function is not required to be redesigned. Therefore, a semiconductor device of which cost is reduced can be manufactured. Since a combination of the IC chips can be easily modified, a semiconductor device having a required function can be provided immediately.

Note that this embodiment mode can be combined as appropriate with Embodiment Modes 1 to 3.

(Embodiment Mode 5)

Figure 11A:
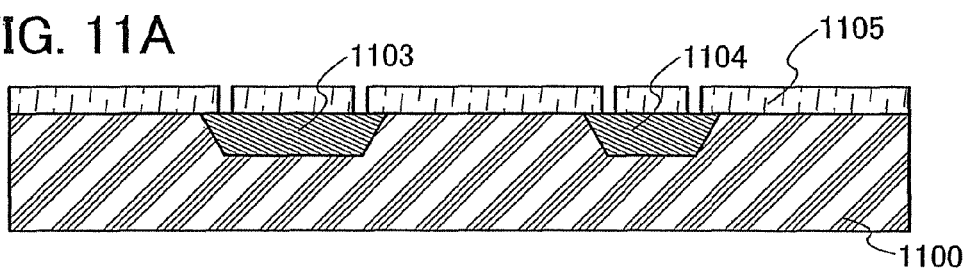
FIGS. 11A to 11C are diagrams showing a manufacturing process of a semiconductor device of the present invention.

In this embodiment mode, a manufacturing method of a semiconductor device using a plurality of IC chips, particularly a manufacturing method of an RFID tag is described below with reference to FIGS. 11A to 11C when an antenna is formed over a base provided with an IC chip, particularly a wiring and an antenna are formed at the same time. Note that steps up to and including the state shown in FIG. 1C of Embodiment Mode 1 can be similarly used in this embodiment mode; therefore, detail description is omitted. In addition, a depression having a protruding portion may be formed, as described in Embodiment Mode 3.

Figure 11B:
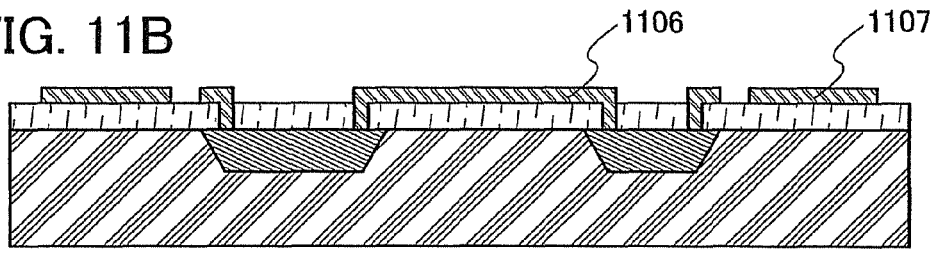

An opening is formed in a protective film 1105 (see FIG. 11A), and then a wiring 1106 is formed to be electrically connected to an electrode of an IC chip (see FIG. 11B). In this case, an antenna 1107 which is electrically connected to the wiring is formed at the same time. Note that at the same time when the opening is formed in the protective film 1105, a protective film on a region in which the antenna 1107 is formed may be removed. A base 1100, an IC chip 1103, an IC chip 1104, and the protective film 1105 in FIG. 11A correspond to the base 100, the IC chip 103, the IC chip 104, and the protective film 105 in FIG. 1, respectively.

Silver (Ag) is preferable as a material of the wiring. However, the material is not limited to this, and a conductive element such as gold (Au), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), or tantalum (Ta), or an alloy or compound material containing such an element as its main component, or the like can be used. As a forming method, an evaporation method, a sputtering method, a CVD method, a printing method, a droplet discharging method, or the like can be used.

Figure 11C:
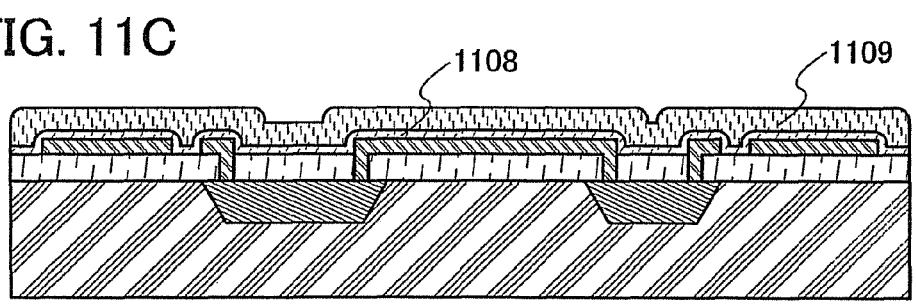

Next, a film 1109 having an adhesive layer 1108 is bonded so as to cover the protective film 1105, the wiring 1106, the antenna 1107, and the like (see FIG. 11C). As the film 1109, a film formed of polypropylene, polyester, vinyl, polyvinyl fluoride, vinyl chloride, or the like, papers made from fibrous material, another base material film (inorganic vapor deposition film or the like), or the like can be used. As the adhesive layer 1108, an adhesive synthetic resin film (an acrylic-based synthetic resin, an epoxy-based synthetic resin, or the like), or the like can be used. The adhesion of the film 1109 is performed by thermo compression bonding.

As described in this embodiment mode, by forming the antenna over the base provided with the IC chip, connection between the antenna and the wiring is performed without using an anisotropic conductive material; thereby reducing a contact defect and suppressing the increase of resistance. In addition, the antenna and the wiring are formed over the same base; a yield depending on alignment during attachment of the antenna can be prevented from being reduced. In addition, since the antenna and the wiring can be formed at the same time, the number of steps can be reduced and a semiconductor device can be manufactured at low cost. Moreover, as described in Embodiment Mode 2 or Embodiment Mode 3, a spare wiring region (lyophilic region) is formed, restoration of a defect due to a wiring can be easily performed by a droplet discharging method, and a yield can be improved. Further, by using a plurality of IC chips each categorized according to function, and an IC chip having a desired function is not required to be redesigned. Therefore, a semiconductor device of which cost is reduced can be manufactured. Since a combination of the IC chips can be easily modified, a semiconductor device having a required function can be provided immediately.

Note that this embodiment mode can be combined as appropriate with Embodiment Modes 1 to 3.

(Embodiment Mode 6)

In this embodiment mode, a manufacturing method of a semiconductor device using a plurality of IC chips, particularly a manufacturing method of an RFID tag is described below with reference to FIGS. 12A to 12E when IC chips are formed over a glass substrate.

First, a step in which an IC chip is formed using a glass substrate is described.

First, a base film 1201 is formed over a substrate 1200. A glass substrate made of barium borosilicate glass, alumino borosilicate glass, or the like, a silicon substrate, a plastic substrate or a resin substrate having heat resistance, or the like can be used as the substrate 1200. As the plastic substrate or resin substrate, polyethylene terephthalate (PET), polyethylene naphthalate (PEN), polyethersulfone (PES), acrylic, polyimide, or the like can be used. The base film 1201 is formed in a single layer or a laminated layer of an oxide or nitride material containing silicon by a CVD method, a plasma CVD method, a sputtering method, a spin coat method, or the like. By forming the base film 1201, a semiconductor film can be prevented from deteriorating due to a contaminant from the substrate 1200.

Figure 12A:
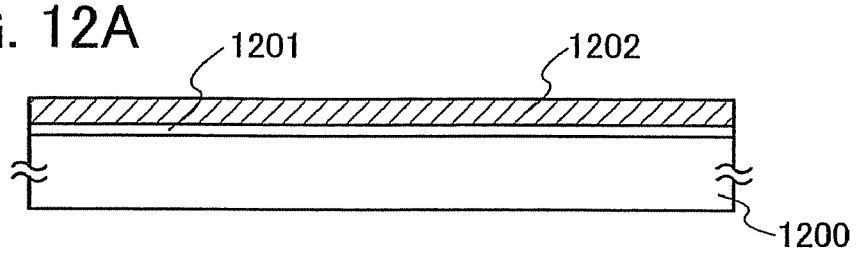
FIGS. 12A to 12E are diagrams showing a manufacturing process of a semiconductor device of the present invention.

Next, a semiconductor film 1202 is formed over the base film 1201 (see FIG. 12A). The semiconductor film 1202 may be formed with a thickness of 25 to 200 nm (preferably, 50 to 150 nm) by a sputtering method, an LPCVD method, a plasma CVD method, or the like. In this embodiment mode, an amorphous semiconductor film is formed and then crystallized. As a material of the semiconductor film 1202, silicon or germanium can be used; however, it is not limited to this.

As a crystallization method, a laser crystallization method, a thermal crystallization method, a thermal crystallization method using an element which promotes crystallization such as nickel, or the like may be used. In the case of not introducing an element which promotes crystallization, hydrogen is released until a concentration of hydrogen contained in the amorphous silicon film becomes $1\times10^{20}$ atoms/cm$^3$ or less, by heating at 500° C. for one hour in a nitrogen atmosphere before irradiating the amorphous silicon film with a laser beam. This is because the amorphous silicon film containing a large amount of hydrogen is damaged when being irradiated with a laser beam.

There is no particular limitation on an introduction method in the case of introducing an element serving as a catalyst into the amorphous semiconductor film as long as the catalytic element can exist on the surface of or inside the amorphous semiconductor film. For example, a sputtering method, a CVD method, a plasma treatment method (including a plasma CVD method), an adsorption method, or a method of applying a metal salt solution can be used. Among them, the method using a solution is advantageous in that it is simple, and easy in terms of concentration control of the metal element. It is preferable to form an oxide film at this time by UV light irradiation in an oxygen atmosphere, a thermal oxidation method, treatment with ozone water or hydrogen peroxide including a hydroxyl radical, or the like in order to spread a water solution over the entire surface of the amorphous semiconductor film.

Crystallization of the amorphous semiconductor film may be performed by a combination of heat treatment and laser irradiation, or by independently performing heat treatment or laser irradiation plural times. Alternatively, laser crystallization and crystallization using a metal element may be used in combination.

Next, a mask of a resist is manufactured using a photolithography step over the crystalline semiconductor film 1202 which is formed by crystallizing the amorphous semiconductor film, and etching is performed using the mask to form a semiconductor region 1203. As for the mask, a commercial resist material containing a photosensitizing agent may be used. For example, a positive type resist or a negative type resist may be used. In using any of the materials, the surface tension and the viscosity can be controlled as appropriate by adjusting the concentration of a solvent, adding a surfactant, or the like.

Note that an insulating film with a thickness of approximately several nanometers may be formed over the semiconductor film before applying a resist in the photolithography step of this embodiment mode. This step can avoid direct contact between the semiconductor film and the resist and can prevent an impurity from entering the semiconductor film.

Next, a gate insulating film 1204 is formed over the semiconductor region 1203. Note that the gate insulating film has a single-layer structure in this embodiment mode; however, it may have a laminated structure of two or more layers. In the case of a laminated structure, the insulating film is preferably formed continuously in the same chamber at the same temperature while keeping a vacuum with reactive gases changed. When the insulating film is continuously formed while keeping a vacuum, an interface between laminated layers can be prevented from being contaminated.

As a material of the gate insulating film 1204, silicon oxide (SiO$_X$: x>0), silicon nitride (SiN$_X$: x>0), silicon oxynitride (SiO$_X$N$_Y$: x>y>0), silicon nitride oxide (SiN$_X$O$_Y$: x>y>0), or the like can be used appropriately. Note that it is preferable that a rare gas element such as argon is included in a reactive gas and mixed into an insulating film to be formed in order to form a dense insulating film with low gate leakage current at low film formation temperature. In this embodiment mode, a silicon oxide film is formed as the gate insulating film 1204 by using SiH$_4$ and N$_2$O as a reactive gas to have a thickness of 10 to 100 nm (preferably, 20 to 80 nm), and for example, 60 nm. Note that the thickness of the gate insulating film 1204 is not limited to this range.

Figure 12B:
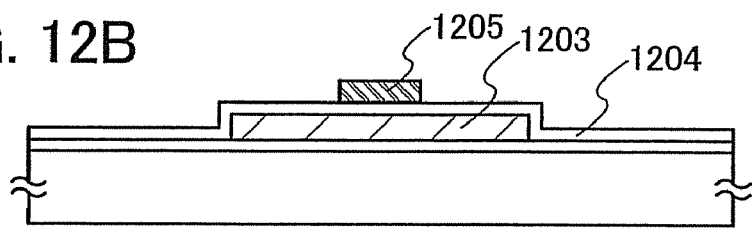

Next, a gate electrode 1205 is formed over the gate insulating film 1204 (see FIG. 12B). The thickness of the gate electrode 1205 is preferably in the range of 10 to 200 nm. Although a manufacturing method of a TFT having a single-gate structure is described in this embodiment mode, a multi-gate structure provided with two or more gate electrodes may be used as well. By using a multi-gate structure, a TFT with an off-state leakage current reduced can be manufactured. As a material of the gate electrode 1205, a conductive element such as silver (Ag), gold (Au), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), or tantalum (Ta), or an alloy or compound material containing such an element as its main component, or the like can be used in accordance with the application. Further, indium tin oxide (ITO) in which indium oxide is mixed with tin oxide; indium tin silicon oxide (ITSO) in which indium tin oxide (ITO) is mixed with silicon oxide; indium zinc oxide (IZO) in which indium oxide is mixed with zinc oxide; zinc oxide (ZnO); tin oxide (SnO$_2$); or the like can also be used. Note that indium zinc oxide (IZO) is a transparent conductive material that is formed by sputtering using a target in which indium oxide is mixed with zinc oxide (ZnO) of 2 to 20 wt %.

Next, an impurity element is added to the semiconductor region 1203 by using the gate electrode 1205 as a mask. Here, a semiconductor region exhibiting n-type conductivity can be formed by adding, for example, phosphorus (P) as an impurity element so as to be contained at a concentration of approximately $5\times10^{19}$/cm$^3$ to $5\times10^{20}$/cm$^3$. Alternatively, a semiconductor region exhibiting p-type conductivity may be formed by adding an impurity element imparting p-type conductivity. As the impurity element imparting n-type conductivity, phosphorus (P), arsenic (As), or the like can be used. As the impurity element imparting p-type conductivity, boron (B), aluminum (Al), gallium (Ga), or the like can be used. Note that an LDD (Lightly Doped Drain) region to which an impurity element is added at a low concentration may be formed. By forming the LDD region, a TFT with an off-state leakage current reduced can be manufactured.

Figure 12C:
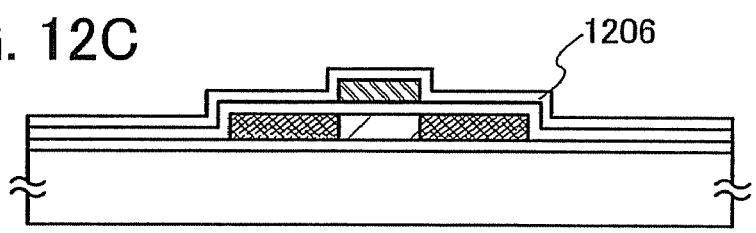
Figure 12D:
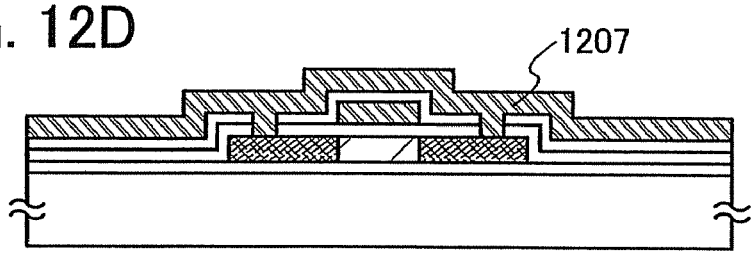

Next, an insulating film 1206 is formed so as to cover the gate insulating film 1204 and the gate electrode 1205 (see FIG. 12C). As a material of the insulating film 1206, silicon oxide (SiO$_X$: x>0), silicon nitride (SiN$_X$: x>0), silicon oxynitride (SiO$_X$N$_Y$: x>y>0), silicon nitride oxide (SiN$_X$O$_Y$: x>y>0), or the like can be used appropriately. Note that the insulating film 1206 has a single-layer structure in this embodiment mode; however, it may have a laminated structure of two or more layers. Further, one or more interlayer insulating films may be provided over the insulating film 1206 as well.

Next, a mask of a resist is manufactured using a photolithography step and the gate insulating film 1204 and the insulating film 1206 are etched to form an opening so as to expose a region of the semiconductor region 1203 to which the impurity element has been added. Then, a conductive film 1207 serving as an electrode is formed to be electrically connected to the semiconductor region 1203 (see FIG. 12D). As a material of the conductive film, a similar material to the gate electrode 1205 can be used.

Figure 12E:
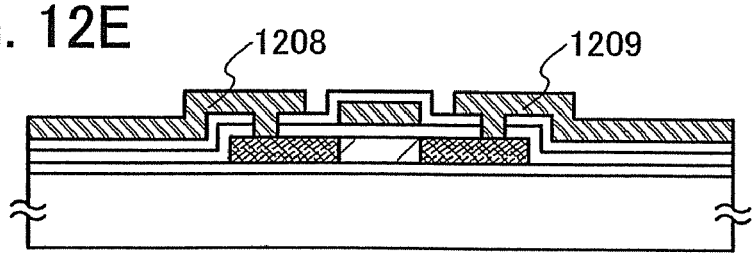

Next, a mask of a resist (not shown) is formed using a photolithography step and the conductive film 1207 is processed into a desired shape using the mask to form a source electrode and a drain electrode 1208 and 1209 (see FIG. 12E).

Note that etching in this embodiment mode may be performed by either plasma etching (dry etching) or wet etching; however, plasma etching is suitable for treating a large-sized substrate. As an etching gas, a gas including any one of a fluorine-based gas such as $CF_4$, $NF_3$, $SF_6$, or $CHF_3$, a chlorine-based gas typified by $Cl_2$, $BCl_3$, $SiCl_4$, $CCl_4$, or the like, and an $O_2$ gas is used, to which an inert gas such as He or Ar may be added as appropriate.

Through the above-described steps, a top-gate thin film transistor formed using a crystalline semiconductor can be manufactured.

By the above-mentioned method or the like, a desired circuit is formed over the glass substrate, and then a scriber is used to form a groove in the glass substrate, and pressure is applied using a breaker, so that a circuit board having thin film transistors is divided into IC chips with desired sizes and shapes. Note that the circuit board can be divided using laser processing, a cutter, or the like without using a scriber or a breaker.

In this embodiment mode, the IC chip is formed using the crystalline semiconductor; however, the present invention is not limited to this, and an amorphous semiconductor may be used. In a circuit portion where a high speed operation is not required, an IC chip can be formed using an amorphous semiconductor.

In addition, in this embodiment mode, the IC chip is formed using the glass substrate; therefore, the shape of the IC chip can be relatively freely decided. This is because a crystalline plane direction is not necessarily considered when the glass substrate is used, compared to the case where the shape of the IC chip is limited depending on the crystalline plane direction when a single crystalline substrate such as a silicon substrate is used. In addition, compared to the case where a silicon substrate or the like is used, the IC chip can be manufactured at lower cost in the case where a glass substrate is used, which is preferable.

A semiconductor device is manufactured using the IC chip which is manufactured in accordance with the above-mentioned steps or the like. As the manufacturing step, the methods described in Embodiment Modes 1 to 5 can be used; however, it is not limited to this. Since the shape of the IC chip manufactured in this embodiment mode can be relatively freely decided, there are various shapes of depressions in accordance with the shape of the IC chip. Since there are various shapes of IC chips and depressions as described above, IC chips having various functions can be disposed at one time and manufactured at low cost. Note that the IC chip using the glass substrate described in this embodiment mode can be combined with an IC chip using a silicon substrate. In this case, an IC chip may be formed using a silicon substrate to form a circuit portion which requires a high speed operation; while another circuit portion which does not require a high speed operation may be formed using a glass substrate.

As described in this embodiment mode, a semiconductor device is manufactured with the IC chip using the glass substrate. Accordingly, the shape of the IC chip can be decided freely; therefore, the IC chips can be selectively disposed on a base even the kinds of IC chips are increased. Compared to the case of using a silicon substrate or the like, since a glass substrate is used, the IC chip can be manufactured at lower cost, which is preferable. As described in Embodiment Mode 4, an antenna is formed over a base; thereby reducing a contact defect and suppressing the increase of resistance. In addition, a yield depending on alignment during attachment of the antenna can be prevented from being reduced. Moreover, as described in Embodiment Mode 2 or Embodiment Mode 3, a spare wiring region (lyophilic region) is formed, restoration of a defect due to the wiring can be easily performed by a droplet discharging method, and a yield can be improved. Further, by using a plurality of IC chips each categorized according to function, and an IC chip having a desired function is not required to be redesigned. Therefore, a semiconductor device of which cost is reduced can be manufactured. Since a combination of IC chips can be easily modified, a semiconductor device having a required function can be provided immediately.

Note that this embodiment mode can be combined as appropriate with Embodiment Modes 1 to 5.

(Embodiment Mode 7)

Figure 13A:
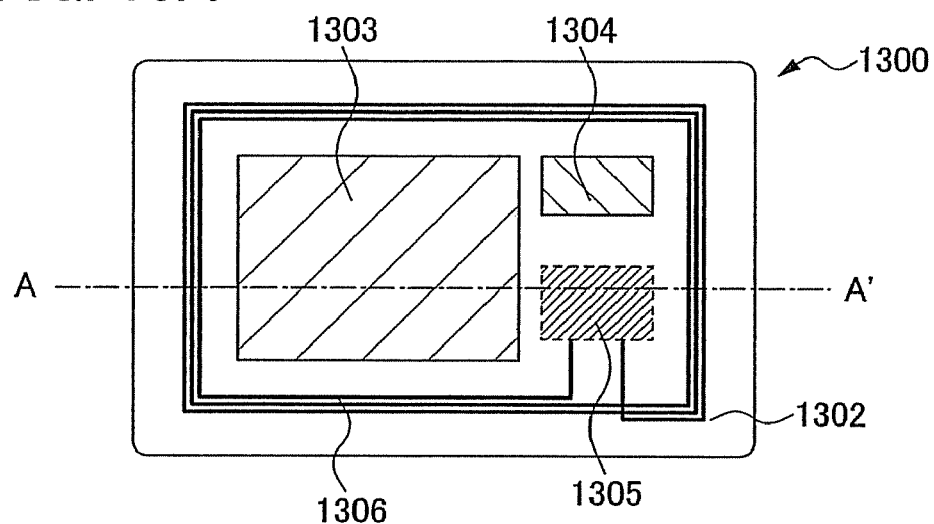
FIGS. 13A and 13B are view showing a semiconductor device of the present invention.

In this embodiment mode, a semiconductor device which has a display portion and has a plurality of IC chips is described with reference to FIGS. 13A, 13B and 14 below. FIG. 13A is a view showing a main body of a semiconductor device 1300 including a display portion 1303, a power supply portion 1304, an integrated circuit portion 1305, and an antenna 1306 connected to the integrated circuit portion. In addition, a surface of the semiconductor device may be provided with a base material formed of paper such as paper board or synthetic paper, or general plastic such as polyethylene, polypropylene, polyester, polyvinyl chloride, or cellulosic based resin, and a printed matter may be printed on the surface to display a unique design or a barcode. However, when these base materials have no light-emitting property, openings are provided over the display portion and the power supply portion, and the display portion and the power supply portion can be recognized from top surfaces of the display portion and the power supply portion. Moreover, the entire semiconductor device may be protected with a film. A film having a resistance to water or a resistance to solvents may be used, and typically, polyethylene, polypropylene, polyethylene terephthalate, vinyl chloride, nylon, or the like can be used as the film.

Figure 13B:
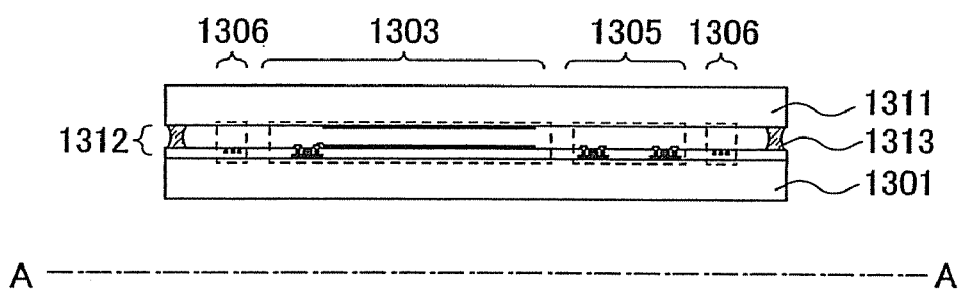

FIG. 13B is a cross-sectional view taken along a line A-A' of the semiconductor device of FIG. 13A. The semiconductor device 1300 described in this embodiment mode has a structure in which a layer 1312 having a semiconductor element and a display element which includes the display portion 1303, the power supply portion 1304, the integrated circuit portion 1305, and the antenna 1306 are interposed between a first base 1301 and a second base 1311. The first base 1301 and the second base 1311 are attached to each other with an adhesive agent 1313. The adhesive agent may be provided between a part of the first base and the second base or may be provided between the entire surfaces of them to attach these bases. In addition, the display portion 1303, the integrated circuit portion 1305, and the power supply portion 1304 are insulated from one another with an insulating material.

A pixel of the display portion 1303 is formed from a display element such as a liquid crystal element, a light-emitting element, or an electrophoresis element. As a driving method of these display elements, either an active matrix type or a passive matrix type can be used. Note that when the display portion is formed from a passive-matrix display element, liquid crystal element or electrophoresis element, a pixel electrode is provided on the second base 1311.

The power supply portion 1304 is provided so as to supply required electric power for driving the display portion 1303, and an ultrathin battery such as a solar battery or a lithium battery is preferably used. When a solar battery is used as the power supply portion, a Schottky type diode, an avalanche type diode, a PIN type diode or a PN type diode each formed of silicon, germanium or the like, a diode using a compound semiconductor such as CdS or GaAs, or an element having a photoelectric conversion layer formed of an organic substance, or the like; specifically, a solar battery cell using a transparent indium tin oxide (ITO) electrode, an organic pigment (a perylene pigment: Me-PTC) vacuum deposited thereover, and a gold electrode formed thereover, or the like can be used. Note that a PIN photodiode includes a p-type semiconductor layer, an n-type semiconductor layer, and an i-type (intrinsic) semiconductor layer which is interposed between the p-type semiconductor layer and the n-type semiconductor layer. Note that when required electric power can be obtained wirelessly, the power supply portion 1304 is not necessarily provided particularly. The integrated circuit portion 1305 is formed using a thin film semiconductor element such as a thin film transistor, a capacitor, a diode, a resistance element, or an inductor.

Here, the integrated circuit portion 1305 can be formed by the method described in one of the embodiment modes in the present invention. Specifically, IC chips are formed such that shapes and sizes are exclusive, and each IC chip is disposed in an appropriate depression. The IC chips each include one or more of circuits which form the integrated circuit portion 1305. Note that the plurality of circuits included in the integrated circuit portion are described below. The other detail is omitted here because the other embodiment modes can be referred to. As described in Embodiment Mode 3, a depression having a protruding portion may be formed in the base. Note that IC chips used for the power supply portion 1304 and the integrated circuit portion 1305 are formed using a thin film semiconductor element such as a transistor, a capacitor, a diode, a resistance element, or an inductor.

As the antenna 1306, a conductive element such as gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), or tantalum (Ta), or an alloy or compound material containing such an element as its main component, or the like can be used.

As a forming method, a wiring forming technique such as a winding method in which a thin wiring is mounted on a base as a film line, an embedding method in which a coil conductive wire is bonded to a integrated circuit and then embedded in the base using an ultrasonic wave, a printing method in which a thin wiring is formed using a conductive paste over the base by a silk printing, an etching method in which a conductive film formed over the base is etched to form a coil-shaped thin wiring, an electrolytic plating method in which a coil-shaped thin wiring is formed in an arbitrary region by applying an electric field, or a droplet discharging method in which a droplet is discharged to form a thin wiring can be used.

The antenna of this embodiment mode surrounds the display portion 1303, the power supply portion 1304, and the integrated circuit portion 1305 to form a coil. Accordingly, an antenna having a small winding number and a long length can be formed. In accordance with radio wave frequency which is used, the antenna is formed to have such a length that the radio wave frequency can be detected.

As the adhesive agent 1313, any kind of adhesive agent such as an epoxy based adhesive agent, an acrylate based adhesive agent, or a silicon based adhesive agent can be used.

A flexible plastic film is used as the first base 1301 and the second base 1311. As the plastic film, polycarbonate (PC), ARTON (manufactured by JSR Co.) formed of a norbornene resin with a polar group, polyethylene terephthalate (PET), polyethersulfone (PES), polyethylene naphthalate (PEN), nylon, polyether ether ketone (PEEK), a polysulfone (PSF), polyetherimide (PEI), polyalylate (PAR), polybutyrene terephthalate (PBT), polyimide, polypropylene, polypropylene sulfide, polyphenylene sulfide, polyphenylene oxide, polysulfone, polyphthalamide, or the like may be used. In addition, an HT substrate (manufactured by Nippon Steel Chemical Co.) in which Tg is 400° C. or higher can be used. A thickness of the second base 1311 is preferably about several hundred micrometers.

Next, a structure of the semiconductor device described in this embodiment mode is described with reference to a block diagram in FIG. 14. A semiconductor device includes an antenna 1401, an integrated circuit portion 1402, a display portion 1403, and a power supply portion 1404. The integrated circuit portion 1402 includes a radio frequency circuit (an RF circuit) 1411, a modulation circuit 1412, a demodulation circuit 1413, a power supply circuit 1414, a CPU 1416, and a memory 1417. A capacitor is incorporated in the power supply circuit 1414, and a resonant circuit is formed with the antenna 1401 and the capacitor. Note that each IC chip may have a structure having one or plural circuits which form the integrated circuit portion 1402.

The memory 1417 includes a ROM (Read Only Memory), a RAM (Random Access Memory), an EEPROM (Electrically Erasable Programmable Read Only Memory), or the like.

The display portion 1403 includes a CPU 1421, a memory 1422, and a pixel portion 1423. A pixel of the pixel portion 1423 is formed from a display element such as a liquid crystal element, a light-emitting element, or an electrophoresis element. The CPU 1421 and the memory 1422 can be formed in the IC chip.

The CPU 1421 in the display portion 1403 reads information stored in the memory 1417 in the integrated circuit portion 1402 based on information transmitted from the CPU 1416 in the integrated circuit portion 1402, and stores the information in the memory 1422 in the display portion 1403 once, and controls to display a part of or all the information on the pixel portion.

The power supply portion 1404 is connected to the CPU 1421 in the display portion 1403, and generates and supplies required electric power for displaying on the display portion 1403. As described above, a solar battery, a lithium battery, or the like can be used as the power supply portion 1404.

Figure 14:
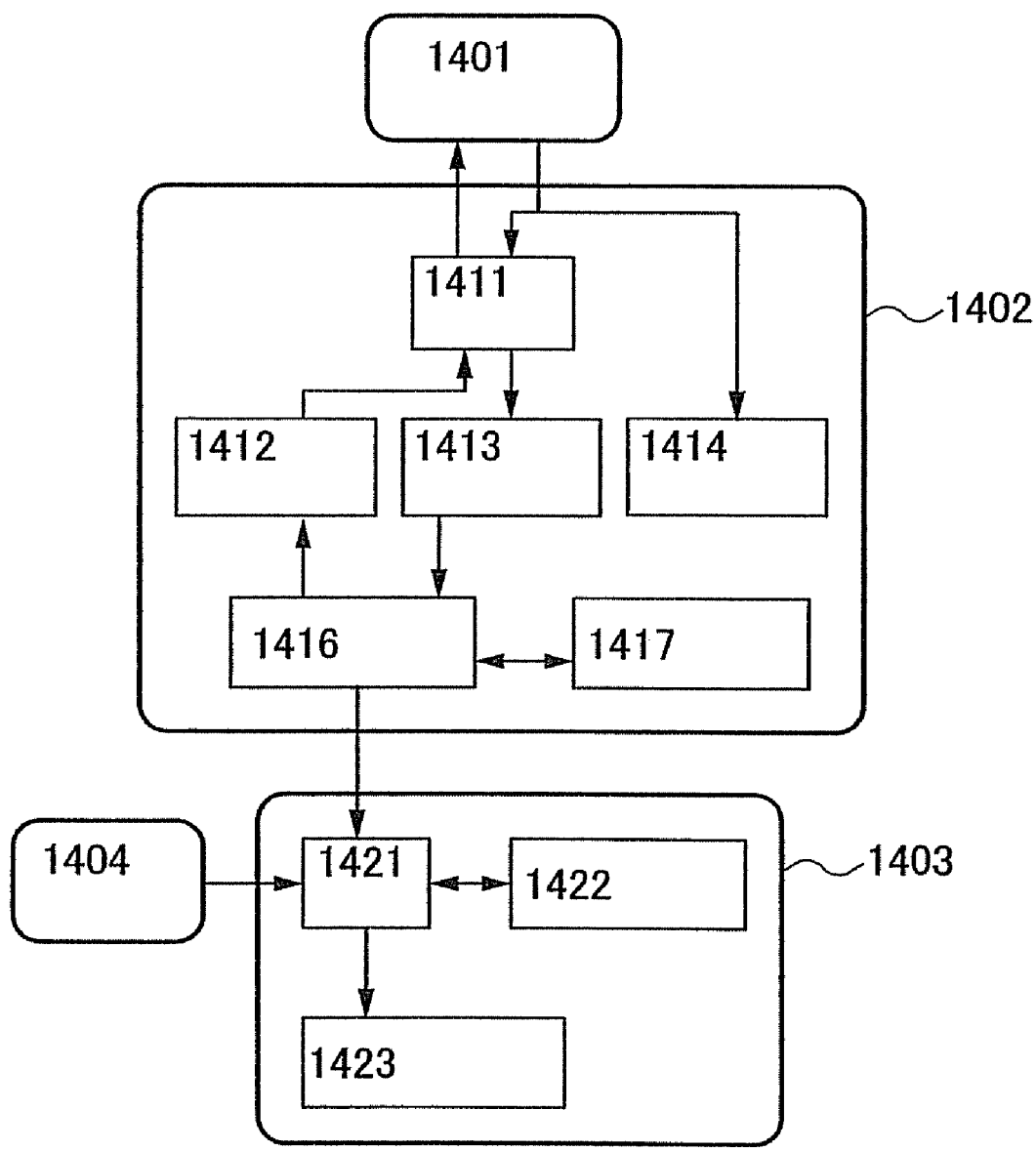
FIG. 14 is a diagram showing a circuit configuration of a semiconductor device of the present invention.

Note that in FIG. 14, the CPU 1421 and the memory 1422 in the display portion 1403 may be incorporated in the CPU 1416 and the memory 1417 in the integrated circuit portion 1402, respectively. In this case, the display of the display portion 1403 can be controlled using the CPU 1416 in the integrated circuit portion 1402.

Next, a method of operating the semiconductor device is described. A manager of an object checks the object by using a reader/writer. Specifically, when the semiconductor device is brought close to a receiving and transmitting antenna of the reader/writer, a high frequency emitted from the antenna which is provided in the reader/writer is received by the antenna 1401. When a radio wave of a specific frequency is received by the antenna, the capacitor of the power supply circuit is filled with electric power generated by mutual induction. The power supply circuit 1414 rectifies this electric power and stabilizes it, and supplies it to each circuit, the CPU and the memory; therefore, the integrated circuit portion is activated.

Next, amplitude of the resonant circuit including the antenna 1401 and the capacitor of the power supply circuit 1414 is increased and sufficient electric power is charged in the capacitor. The power supply circuit 1414 rectifies this electric power and stabilizes it; and supplies to each circuit, the CPU and the memory. Therefore, the integrated circuit portion is activated, and an interrogation signal of an original digital signal is reproduced in the demodulation circuits 1413 through the RF circuit 1411. The CPU 1416 transmits the information of the object written in the memory 1417 based on this interrogation signal. The transmission of the information is performed such that a binarized data signal is modulated in the modulation circuit 1412 in the integrated circuit portion and amplified in the RF circuit 1411 to be transmitted from the antenna 1401. The transmitted data is received by the reader/writer, and the information of the object is recorded in a memory of a managing computer in a processing portion and displayed on a display portion of the managing computer.

In addition, a data signal is transmitted from the CPU 1416 in the integrated circuit portion 1402 to the CPU 1421 in the display portion 1403. The CPU 1421 in the display portion 1403 uses electric power from the power supply portion 1404 so that information based on this data signal is stored in the memory 1422 in the display portion and required information is displayed on the pixel portion 1423.

With the above-described operation, the information stored in the integrated circuit portion in the semiconductor device can be displayed on the display portion, and the information can be transmitted to the reader/writer.

Since the semiconductor device of this embodiment mode includes the display portion, the power supply portion, and the integrated circuit portion, a part of the informational stored in the memory of the integrated circuit portion can be displayed on the display portion. Therefore, required information can be obtained by watching a wireless tag if necessary. Accordingly, a printing paper for recording information is not required, and cost can be reduced.

In addition, the display portion is driven using electric power which is generated in the power supply portion; therefore, eye-friendly display can be provided.

Further, by using a plurality of IC chips each categorized according to function, an IC chip having a desired function is not required to be redesigned. Therefore, a semiconductor device of which cost is reduced can be manufactured. Since a combination of IC chips can be easily modified, a semiconductor device having a required function can be provided immediately. A depression having a protruding portion is formed, so that restoration can be easily performed when a defect is generated in the IC chip or the wiring. Accordingly, a yield can be improved. In addition, a spare wiring region (lyophilic region) is formed, restoration of a defect due to a wiring can be easily performed by a droplet discharging method, and a yield can be improved. An antenna is formed over the base; thereby reducing a contact defect and suppressing the increase of resistance. In addition, a yield depending on alignment during attachment of the antenna can be prevented from being reduced. By forming a semiconductor device with IC chips which uses a glass substrate, a shape of the IC chip can be decided freely; therefore, the IC chips can be selectively disposed in the base even when the kinds of IC chips are increased. Since the glass substrate is used, compared to the case of using a silicon substrate or the like, the semiconductor device can be manufactured at lower cost.

Note that the example of use described in this embodiment mode is just one mode, and a structure, a method of use, and the like are not limited to this embodiment mode. In addition, this embodiment mode can be combined as appropriate with Embodiment Modes 1 to 6.

(Embodiment Mode 8)

Figure 15:
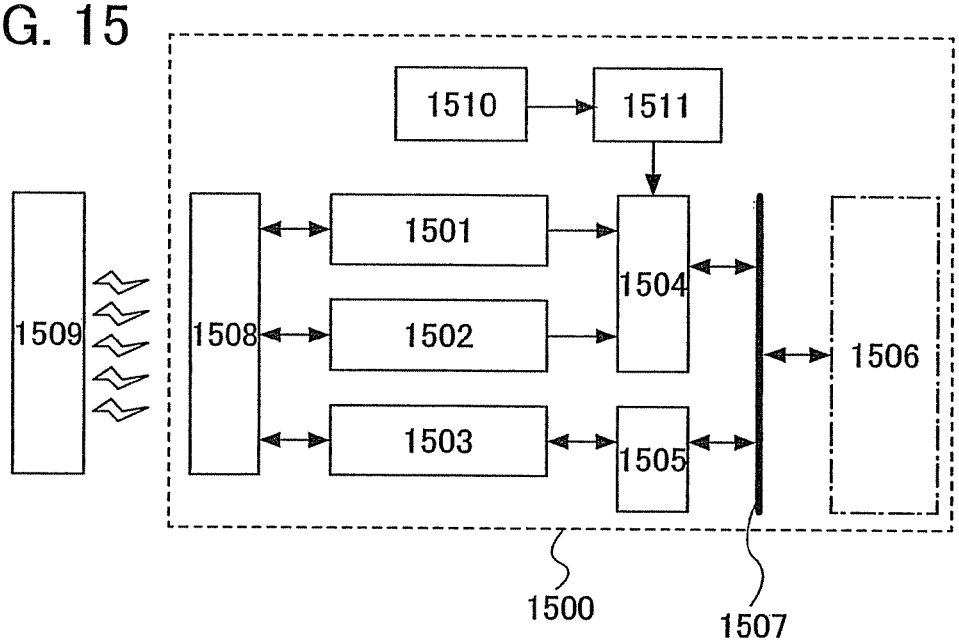
FIG. 15 is a diagram showing a circuit configuration of a semiconductor device of the present invention.

Another structure of a semiconductor device manufactured in the present invention is described with reference to FIG. 15. As shown in FIG. 15, a semiconductor device 1500 according to the present invention has a function of non-contact communication of data, and includes a power supply circuit 1501, a clock generating circuit 1502, a data demodulation circuit/data modulation circuit 1503, a control circuit 1504 for controlling other circuits, an interface circuit 1505, a memory circuit 1506, a data bus 1507, an antenna (antenna coil) 1508, a sensor 1510, a sensor circuit 1511, and the like.

The power supply circuit 1501 generates various kinds of power voltages to be supplied to each circuit inside the semiconductor device 1500, based on an AC signal inputted from the antenna 1508. The clock generating circuit 1502 generates various kinds of clock signals to be supplied to each circuit inside the semiconductor device 1500 based on the AC signal inputted from the antenna 1508. The data demodulation circuit/data modulation circuit 1503 has a function of demodulating/modulating data to communicate with a reader/writer 1509. The control circuit 1504 has a function of controlling the memory circuit 1506. The antenna 1508 has a function of transmitting/receiving an electromagnetic wave. The reader/writer 1509 communicates data with the semiconductor device, and controls the process of the data. Note that the structure of the semiconductor device is not limited to the above-described structure, and for example, another element such as a limiter circuit of power supply voltage and hardware dedicated to encryption processing may be added in the semiconductor device, or the semiconductor device may have a structure in which a part of function is omitted.

The memory circuit 1506 has a structure including a memory element in which an organic compound layer or a phase-change layer is interposed between a pair of conductive layers. Note that the memory circuit 1506 may include only the memory element in which an organic compound layer or a phase-change layer is interposed between a pair of conductive layers. In addition, the memory circuit may include another memory circuit having a different structure. The memory circuit having a different structure includes, for example, one or more selected from a DRAM, an SRAM, an FeRAM, a mask ROM, a PROM, an EPROM, an EEPROM, a flash memory, or the like.

The sensor 1510 is formed from an element such as a resistor element, a capacitive coupling element, an inductive coupling element, a photovoltaic element, a photoelectric conversion element, a thermoelectromotive force element, a transistor, a thermistor, or a diode. The sensor circuit 1511 detects a change in impedance, reactance, inductance, voltage, or current, and performs analog/digital conversion (A/D conversion) to output a signal to the control circuit 1504. Note that either a structure having the sensor circuit 1511 or a structure which does not have a sensor circuit may be used. In accordance with the present invention, since a function is easily added and omitted, a semiconductor device which satisfies a required function can be provided immediately.

Note that this embodiment mode can be combined as appropriate with Embodiment Modes 1 to 7.

(Embodiment Mode 9)

Figure 16A:
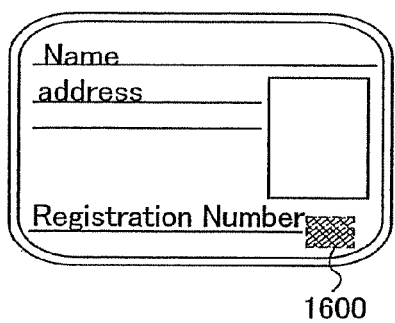
FIGS. 16A to 16F are views showing examples of using a semiconductor device of the present invention.
Figure 16B:
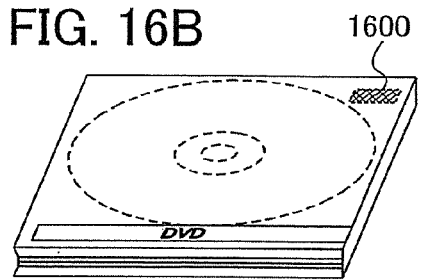
Figure 16C:
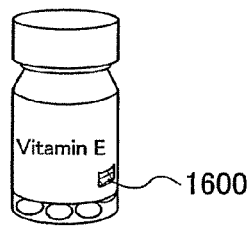
Figure 16D:
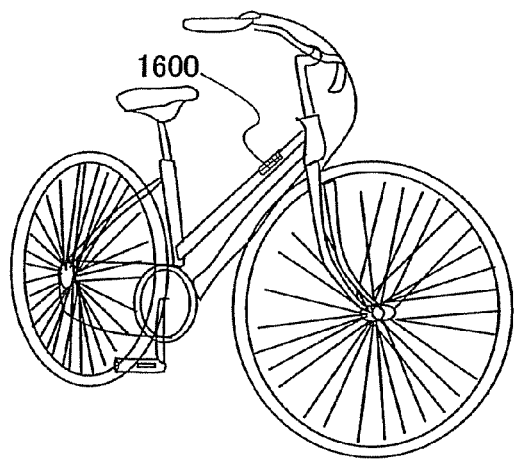
Figure 16E:
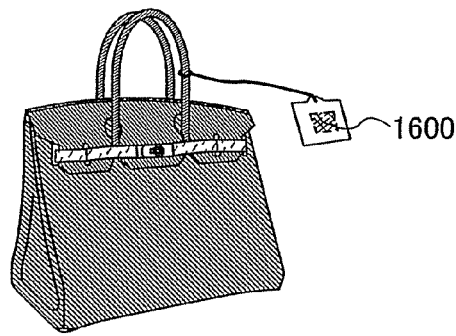
Figure 16F:
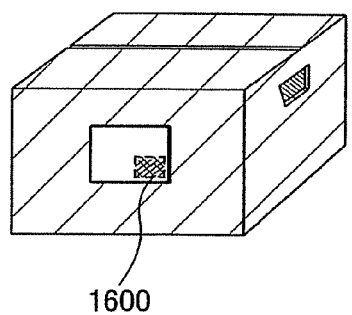

In accordance with the present invention, a semiconductor device functioning as an RFID tag can be formed. An RFID tag can be used in a wide variety of applications, and may be used by being mounted on objects such as bills, coins, securities, bearer bonds, certificates (driver's licenses, resident cards, and the like, see FIG. 16A), containers for wrapping objects (wrapping paper, bottles, and the like, see FIG. 16C), recording media (DVD software, video tapes, and the like, see FIG. 16B), vehicles (bicycles and the like, see FIG. 16D), personal belongings (bags, glasses, and the like), foods, plants, clothes, lifestyle goods, and products such as electronic devices, or shipping tags of baggage (see FIGS. 16E and 16F). Note that the RFID tags are indicated by reference numeral 1600 in FIGS. 16A to 16F.

Note that the electronic device indicates a liquid crystal display device, an EL display device, a television unit (also simply referred to as a TV, a TV receiver, or a television receiver), a cellular phone, and the like for example. In addition, the above-described semiconductor device can be used for animals, human bodies, or the like.

The RFID tag is attached to a surface of an object, or incorporated to be fixed on an object. For example, the RFID tag may be incorporated in paper of a book, or an organic resin of a container for wrapping an object to be fixed on each object. By providing an RFID tag in bills, coins, securities, bearer bonds, certificates, and the like, forgery can be prevented. Further, by providing an RFID tag in containers for wrapping objects, recording media, personal belongings, foods, clothes, lifestyle goods, electronic devices, and the like, inspection systems, rental systems and the like can be performed more efficiently. An RFID tag which can be manufactured according to the present invention easily incorporates various functions and can be manufactured at low cost.

When the chip having an RFID tag formed in accordance with the present invention is applied to management system or a distribution system of articles, the system can have high functionality. For example, information which is recorded in an RFID tag provided in a tag is read by a reader/writer provided near a conveyor belt, then information about a distribution process or a delivery destination is read out, and inspection of merchandise or distribution of goods can be easily carried out.

Note that this embodiment mode can be combined as appropriate with Embodiment Modes 1 to 8.

This application is based on Japanese Patent Application serial No. 2006-002130 filed in Japan Patent Office on Jan. 10, 2006, the entire contents of which are hereby incorporated by reference.

What is claimed is:

1. A manufacturing method of a semiconductor device, comprising:
preparing a base formed of a resin;
forming a first depression and a second depression in the base, wherein the first depression has a protruding portion formed of the resin;
disposing an IC chip which fits the second depression, into the second depression; and
removing the protruding portion of the first depression after disposing the IC chip into the second depression,
wherein the IC chip is disposed in liquid, and
wherein the protruding portion is removed by irradiation with a laser beam.

2. The method according to claim 1,
wherein the IC chip comprises a thin film transistor.

3. The method according to claim 1,
wherein the IC chip has a function selected from the group consisting of a memory, a CPU, an RF circuit, and a controller circuit.

4. The method according to claim 1 further comprising:
forming an antenna electrically connected to the IC chip.

5. The method according to claim 4,
wherein the antenna is formed by a method selected from the group consisting of a plasma CVD method, a sputtering method, a printing method, and a droplet discharging method.

6. The method according to claim 1, further comprising:
forming a wiring electrically connected to the IC chip.

7. The method according to claim 6,
wherein the wiring is formed by a method selected from the group consisting of an evaporation method, a sputtering method, a CVD method, a printing method, and a droplet discharging method.

8. A manufacturing method of a semiconductor device, comprising:
preparing a base formed of a resin;
forming a first depression and a second depression in the base, wherein the first depression has a protruding portion formed of the resin;
disposing a first IC chip which fits the second depression into the second depression, wherein the first IC chip is disposed in liquid;
removing the protruding portion of the first depression after disposing the first IC chip into the second depression; and
disposing a second IC chip which fits the first depression of which the protruding portion has been removed into the first depression of which the protruding portion is removed,
wherein the protruding portion is removed by irradiation with a laser beam.

9. The method according to claim 8,
wherein the second IC chip comprises a thin film transistor.

10. The method according to claim 8,
wherein the second IC chip has a function selected from the group consisting of a memory, a CPU, an RF circuit, and a controller circuit.

11. The method according to claim 8 further comprising:
forming an antenna electrically connected to the second IC chip.

12. The method according to claim 11,
wherein the antenna is formed by a method selected from the group consisting of a plasma CVD method, a sputtering method, a printing method, and a droplet discharging method.

13. The method according to claim 8 further comprising:
forming a wiring electrically connected to the second IC chip.

14. The method according to claim 13,
wherein the wiring is formed by a method selected from the group consisting of an evaporation method, a sputtering method, a CVD method, a printing method, and a droplet discharging method.

* * * * *